(12) United States Patent
Yoshimura et al.

(10) Patent No.: US 11,600,629 B2
(45) Date of Patent: Mar. 7, 2023

(54) SEMICONDUCTOR MEMORY DEVICE AND METHOD OF MANUFACTURING SEMICONDUCTOR MEMORY DEVICE

(71) Applicant: Kioxia Corporation, Tokyo (JP)

(72) Inventors: Naoya Yoshimura, Kuwana Mie (JP); Satoshi Nagashima, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 310 days.

(21) Appl. No.: 16/814,517

(22) Filed: Mar. 10, 2020

(65) Prior Publication Data

US 2021/0036000 A1 Feb. 4, 2021

(30) Foreign Application Priority Data

Aug. 2, 2019 (JP) .............................. JP2019-143072

(51) Int. Cl.
| | |
|---|---|
| *H01L 27/11556* | (2017.01) |
| *G11C 5/06* | (2006.01) |
| *G11C 5/02* | (2006.01) |
| *H01L 27/11582* | (2017.01) |

(52) U.S. Cl.
CPC ........ *H01L 27/11556* (2013.01); *G11C 5/025* (2013.01); *G11C 5/06* (2013.01); *H01L 27/11582* (2013.01)

(58) Field of Classification Search
CPC ......... H01L 27/11556; H01L 27/11582; H01L 27/11519; H01L 27/1157; H01L 27/11524; H01L 27/11529; H01L 27/11548; H01L 27/11573; H01L 27/11575; H01L 27/11273–1128; H01L 27/11551; H01L 27/11578; H01L 27/11597; H01L 27/2481; H01L 27/249; G11C 5/025; G11C 5/06
See application file for complete search history.

(56) References Cited

U.S. PATENT DOCUMENTS

| | | | |
|---|---|---|---|
| 9,076,722 B2 | 7/2015 | Sakuma | |
| 9,748,265 B1 | 8/2017 | Lee | |
| 10,910,388 B2 * | 2/2021 | Fukuda | ............ H01L 29/40117 |
| 2008/0277716 A1 | 11/2008 | Nishida | |
| 2016/0190147 A1 | 6/2016 | Kato | |

FOREIGN PATENT DOCUMENTS

JP    H08-097306 A    4/1996

* cited by examiner

*Primary Examiner* — Cuong B Nguyen
(74) *Attorney, Agent, or Firm* — Foley & Lardner LLP

(57) ABSTRACT

A semiconductor memory device includes a first pillar. The first pillar includes a first portion and a second portion. The first portion includes a first semiconductor layer and a first insulating film on a side surface of the first semiconductor layer. The first pillar includes a first region that faces the first portion and a second region other than the first region. The second portion includes a first conductive film that is in contact with the first insulating film and a second insulating film. The second insulating film has a first thickness in a fourth direction within the second region and a second thickness in the second direction within the first region. The first thickness is greater than the second thickness.

16 Claims, 25 Drawing Sheets

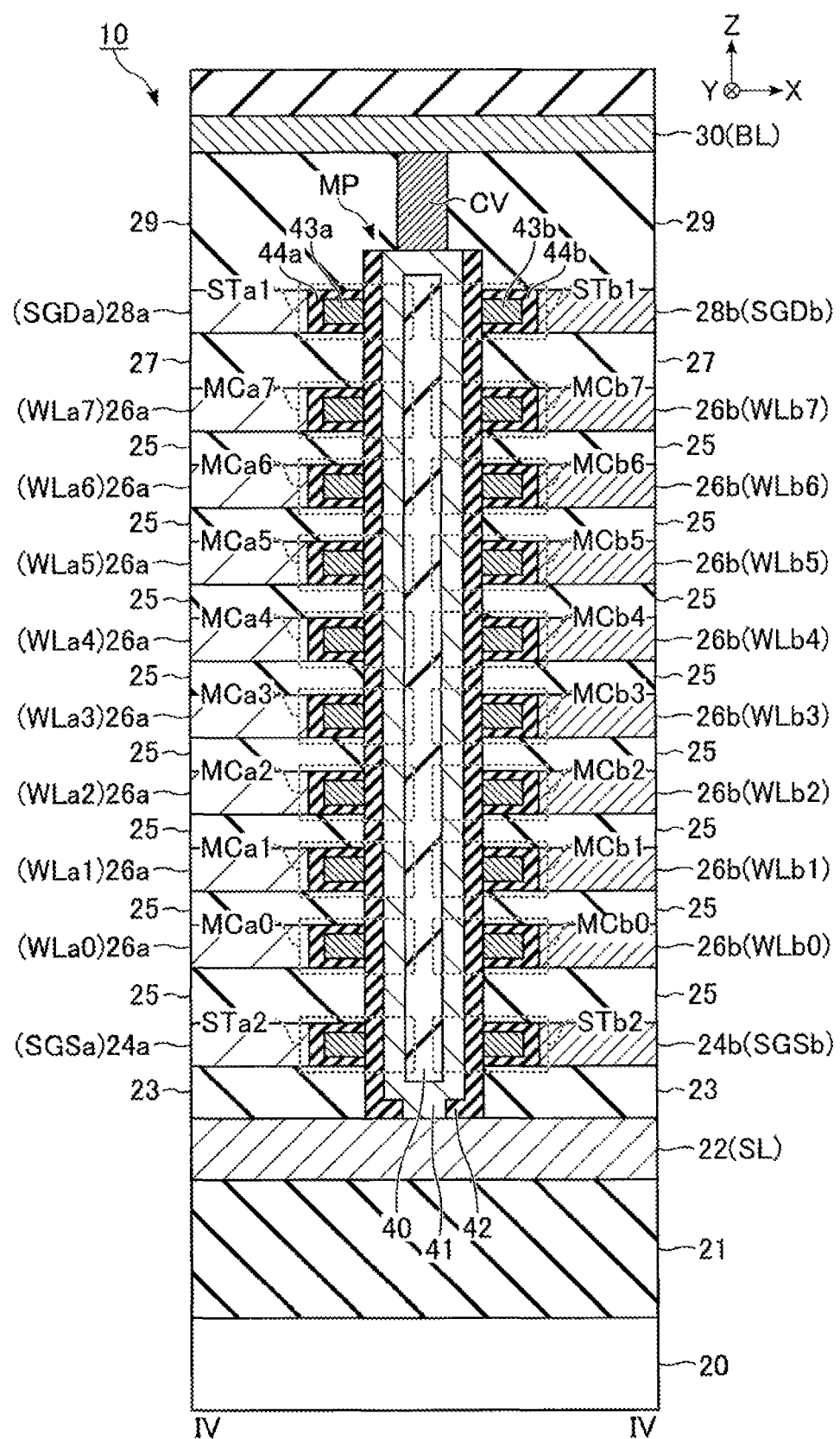
F I G. 4

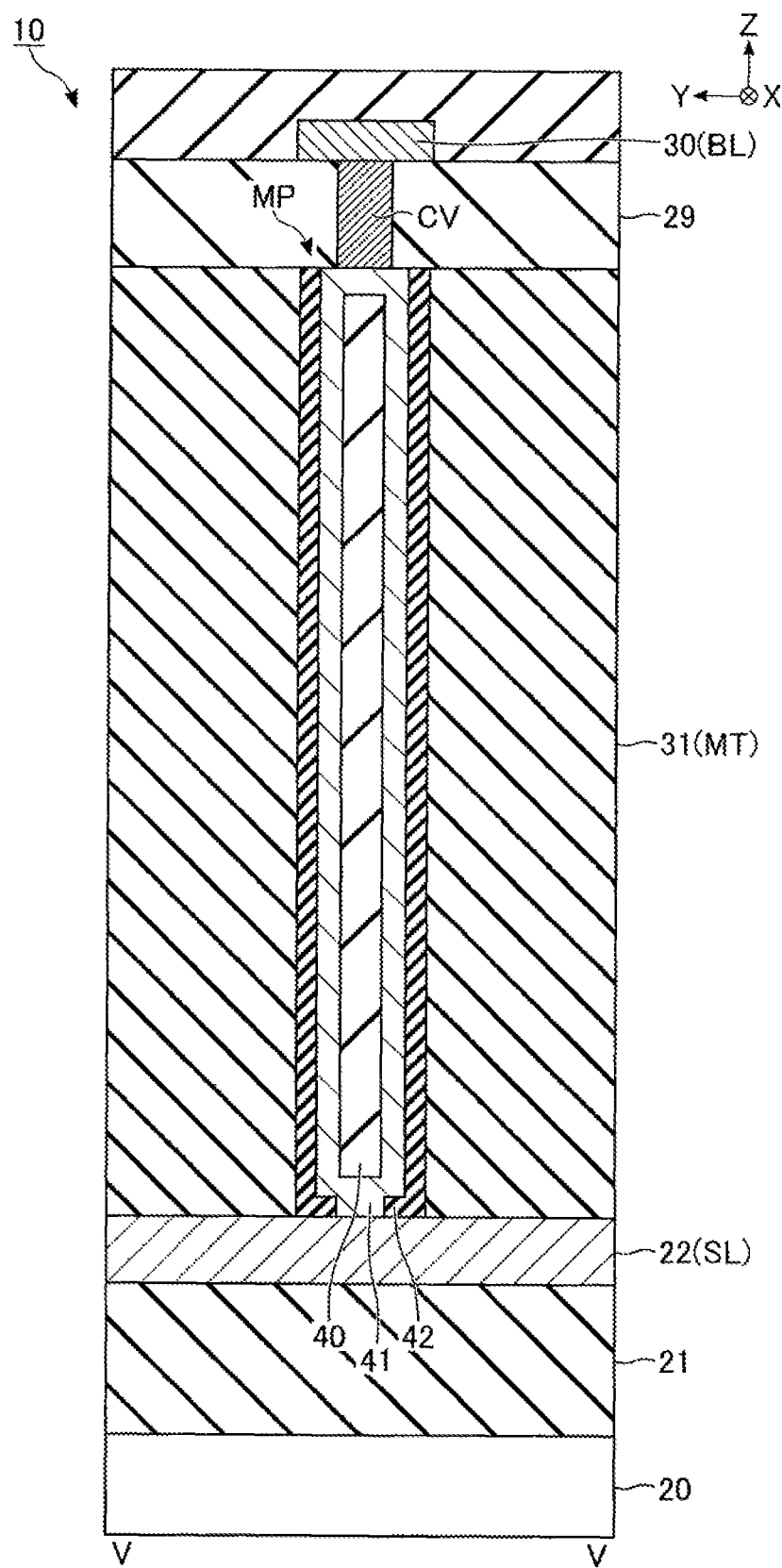
F I G. 5

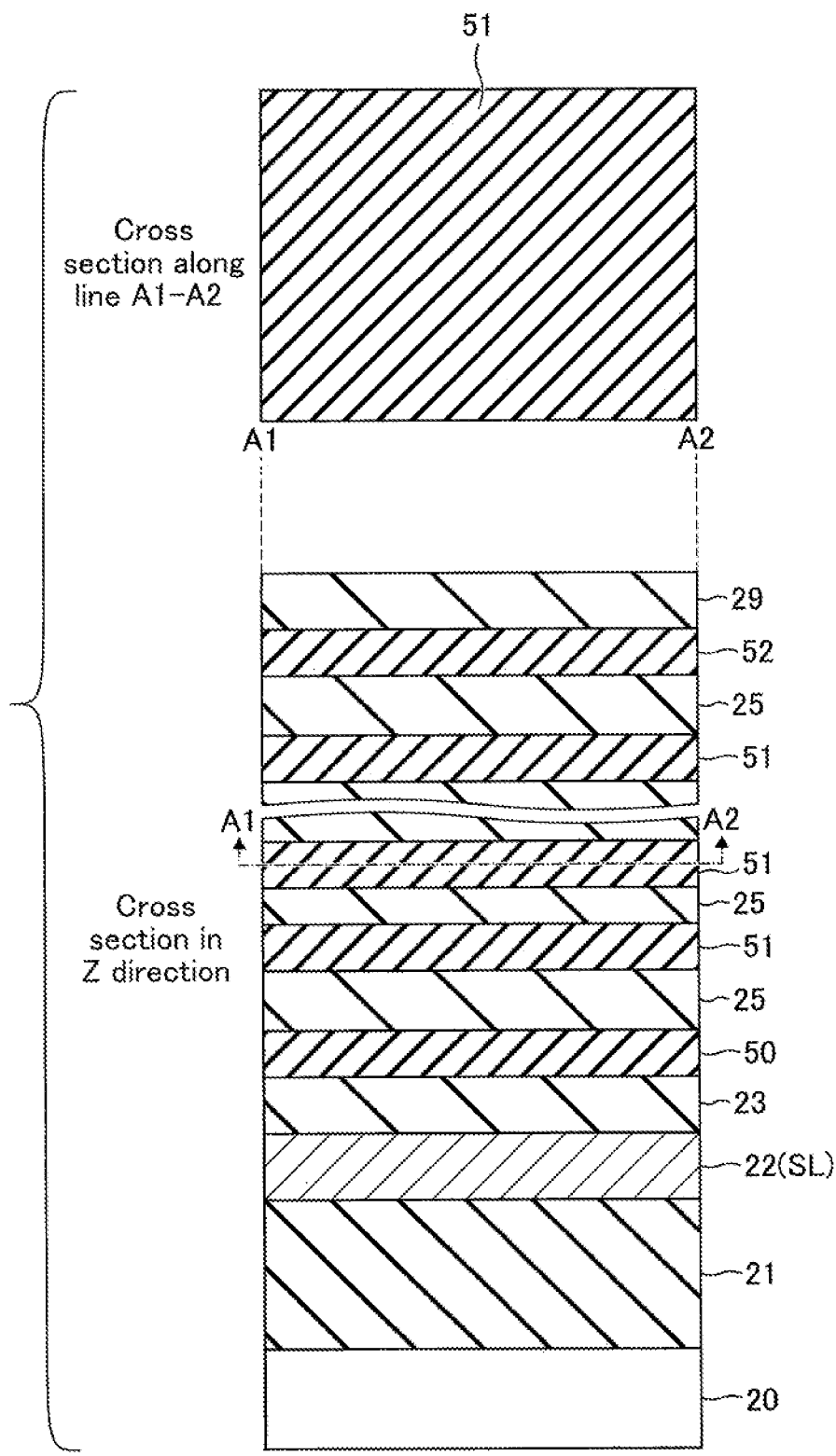
F I G. 10

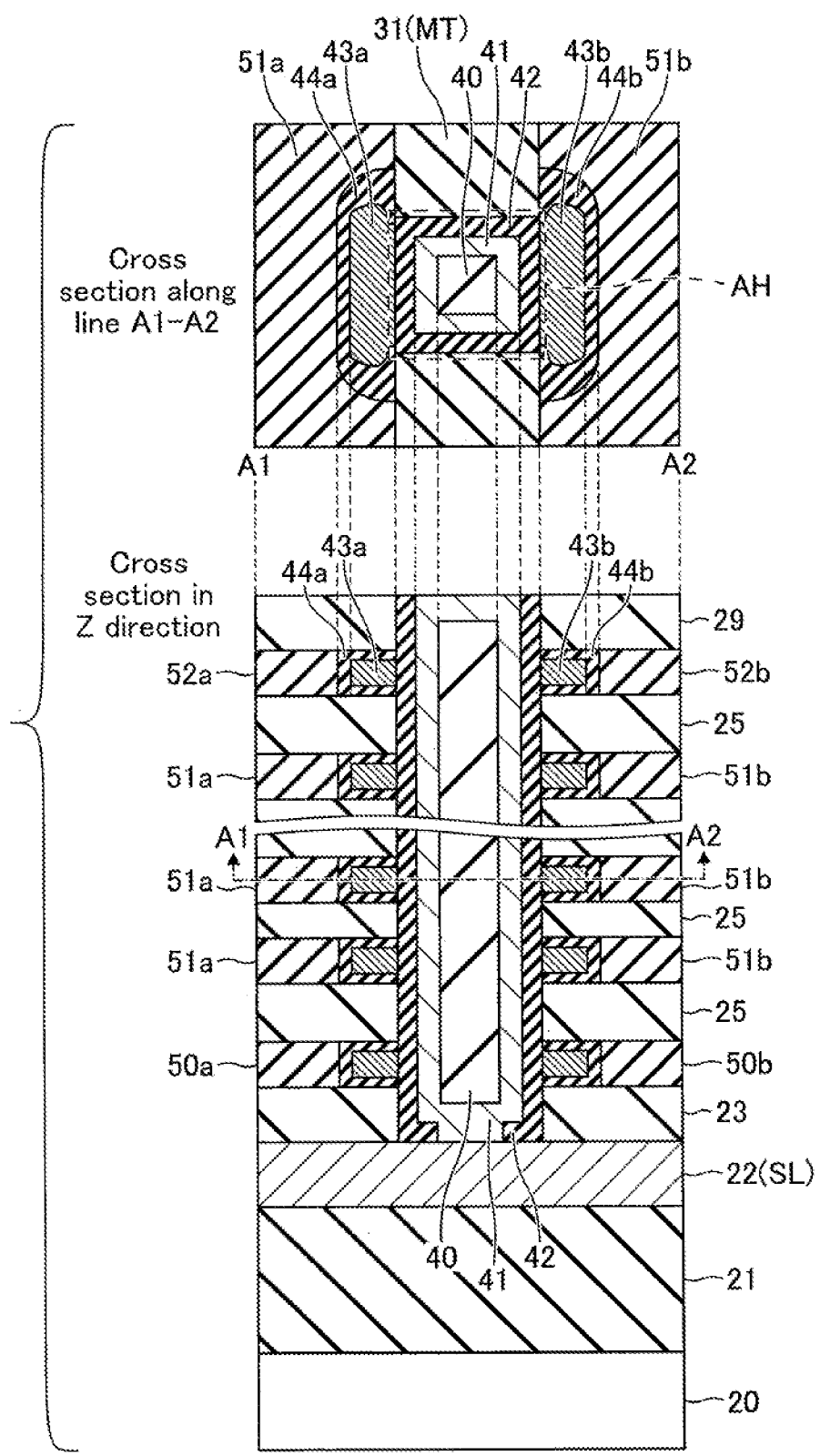
F I G. 18

SEMICONDUCTOR MEMORY DEVICE AND METHOD OF MANUFACTURING SEMICONDUCTOR MEMORY DEVICE

CROSS-REFERENCE TO RELATED APPLICATIONS

This application is based upon and claims the benefit of priority from Japanese Patent Application No. 2019-143072, filed Aug. 2, 2019, the entire contents of which are incorporated herein by reference.

FIELD

Embodiments described herein relate generally to a semiconductor memory device and a method of manufacturing the semiconductor memory device.

BACKGROUND

A NAND-type flash memory capable of storing data in a non-volatile manner is known.

BRIEF DESCRIPTION OF THE DRAWINGS

FIG. 4 is a cross-sectional view, taken along line IV-IV of FIG. 3, showing an example of a cross-sectional structure of the memory cell array included in the semiconductor memory device according to the first embodiment.

FIG. 5 is a cross-sectional view, taken along line V-V of FIG. 3, showing an example of a cross-sectional structure of the memory cell array included in the semiconductor memory device according to the first embodiment.

FIGS. 10 to 19 are cross-sectional views of the memory cell array showing examples of cross-sectional structures in the middle of the manufacturing process of the semiconductor memory device according to the first embodiment.

DETAILED DESCRIPTION

Figure 1:
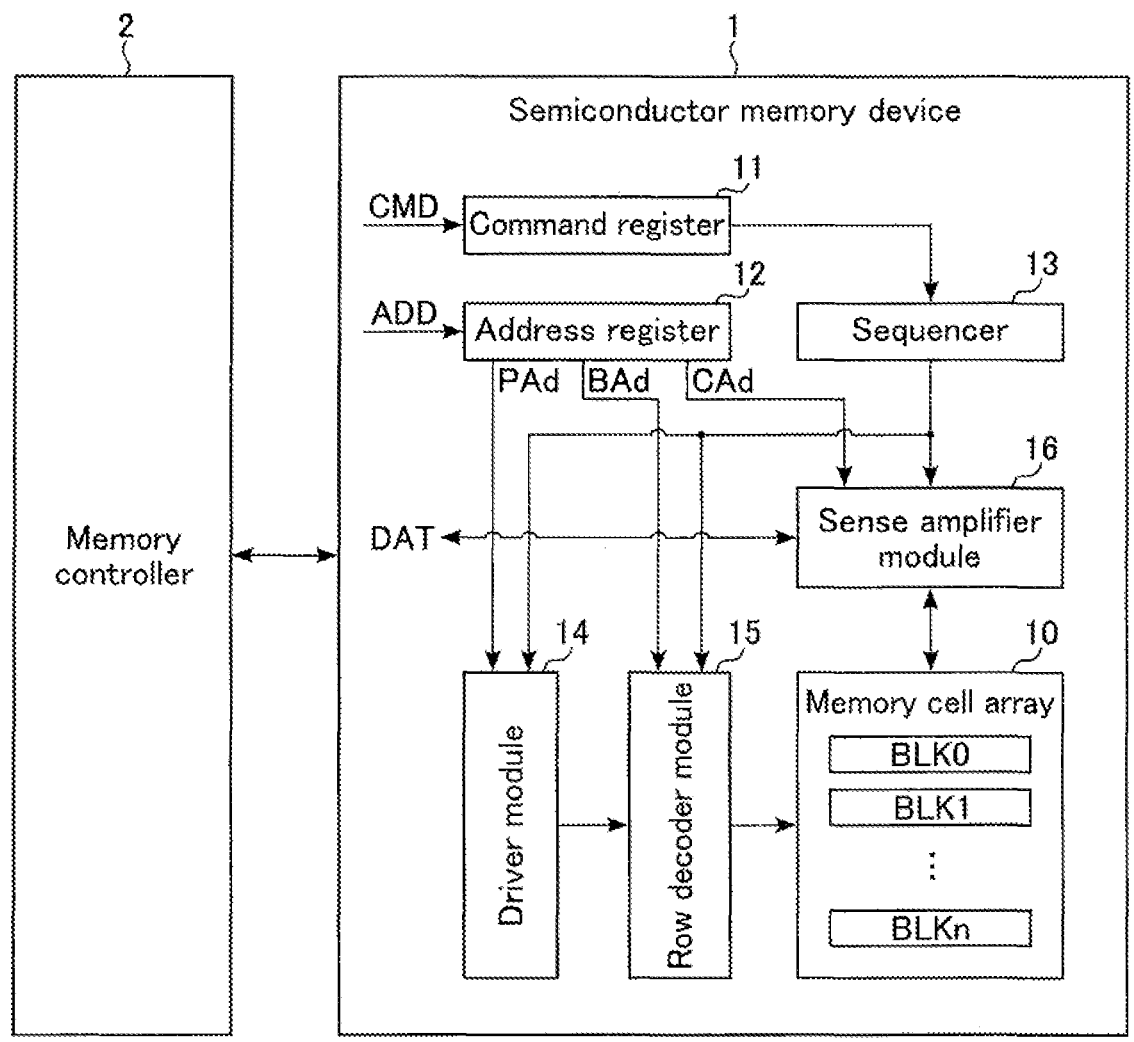
FIG. 1 is a block diagram showing a configuration example of a semiconductor memory device according to a first embodiment.

A semiconductor memory device includes a first conductive layer, a first insulating region, and a first pillar.

The first conductive layer extends in a first direction within a first layer. The first insulating region extends in the first direction within the first layer. The first insulating region is adjacent to the first conductive layer in a second direction intersecting the first direction. The first pillar extends in a third direction intersecting the first direction and the second direction, and divides the first insulating region. The first pillar is provided in contact with the first conductive layer.

The first pillar includes a first portion and a second portion. The first portion divides the first insulating region. The second portion includes a part isotropically extending from the first portion toward the first conductive layer within the first layer.

The first portion includes a first semiconductor layer extending in the third direction and a first insulating film provided on a side surface of the first semiconductor layer. The first pillar includes a first region that faces the first portion in the first direction and a second region other than the first region.

The second portion includes a first conductive film that is in contact with the first insulating film and a second insulating film provided between the first conductive film and the first conductive layer. The second insulating film has a first thickness in a fourth direction intersecting the first to third directions within the second region. The second insulating film has a second thickness in the second direction within the first region. The first thickness is greater than the second thickness.

Hereinafter, the embodiments will be described with reference to the accompanying drawings. Each embodiment exemplifies a device and a method for embodying the technical idea of the embodiment. It should be noted that the drawings are schematic or conceptual, and that the dimensions and scale of the drawings are not necessarily the same as those of the actual products. All descriptions of an embodiment are applicable to descriptions of another embodiment, unless explicitly or obviously excluded. The technical idea of the embodiments is not specified by the shape, structure, arrangement, etc. of structural elements.

In the following description, structural elements having substantially the same function and configuration will be assigned the same reference symbol. A numeral following letters constituting a reference symbol is used for distinction between elements referred to by reference symbols including the same letters and having the same configuration. If elements represented by reference symbols including the same letters need not be distinguished, those elements are assigned reference symbols including only the same letters.

[1] First Embodiment

Hereinafter, a semiconductor memory device 1 according to the embodiment will be described.

[1-1] Configuration of Semiconductor Memory Device 1

[1-1-1] Overall Configuration of Semiconductor Memory Device 1

FIG. 1 shows a configuration example of the semiconductor memory device 1 according to the first embodiment. The semiconductor memory device 1 is, for example, a NAND flash memory, which is capable of storing data in a non-volatile manner. The semiconductor memory device 1 is controlled by an external memory controller 2.

As shown in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer not less than 1). A block BLK includes a group of a plurality of memory cell transistors capable of storing data in a non-volatile manner, and is used as, for example, a data erasure unit. A Source line SL, word lines WL, bit lines BL, etc. (not illustrated) are connected to the memory cell array 10. Each memory cell transistor is associated with, for example, one bit line and one word line. A detailed configuration of the memory cell array 10 will be described later.

The command register 11 retains a command CMD that is received by the semiconductor memory device 1 from the memory controller 2. The command CMD includes, for example, commands to cause the sequencer 13 to execute a read operation, a write operation, and an erase operation.

The address register 12 retains address information ADD received by the semiconductor memory device 1 from the memory controller 2. The address information ADD includes, for example, a block address BAd, a page address PAd, and a column address CAd. For example, the block address BAd, the page address PAd, and the column address CAd are used to select a block BLK, a word line WL, and a bit line BL, respectively.

The sequencer 13 controls the entire operation of the semiconductor memory device 1. For example, the sequencer 13 performs a read operation, a write operation, and an erase operation by controlling the driver module 14, the row decoder module 15, and the sense amplifier module 16, etc. based on a command CMD retained in the command register 11.

The driver module 14 generates a voltage for use in a read operation, a write operation, an erase operation, and the like, and supplies the generated voltage to the row decoder module 15. The driver module 14 applies the generated voltage to a signal line corresponding to the selected word line WL based on, for example, the page address PAd retained in the address register 12.

The row decoder module 15 selects one block BLK in the corresponding memory cell array 10, based on the block address BAd retained in the address register 12. The row decoder module 15 transfers, for example, the voltage applied to the signal line corresponding to the selected word line WL to the selected word line WL in the selected block BLK.

The sense amplifier module 16, in a write operation, applies a desired voltage to each bit line BL in accordance with write data DAT received from the memory controller 2. The sense amplifier module 16, in a read operation, determines data stored in a memory cell transistor MC based on the voltage of the bit line BL, and transfers the determination result as read data DAT to the memory controller 2.

The semiconductor memory device 1 and the memory controller 2 as described above may be combined to constitute one semiconductor device. Such a semiconductor device may be a memory card, such as an SD™ card, and a solid state drive (SSD), for example.

[1-1-2] Circuit Configuration of Memory Cell Array 10

Figure 2:
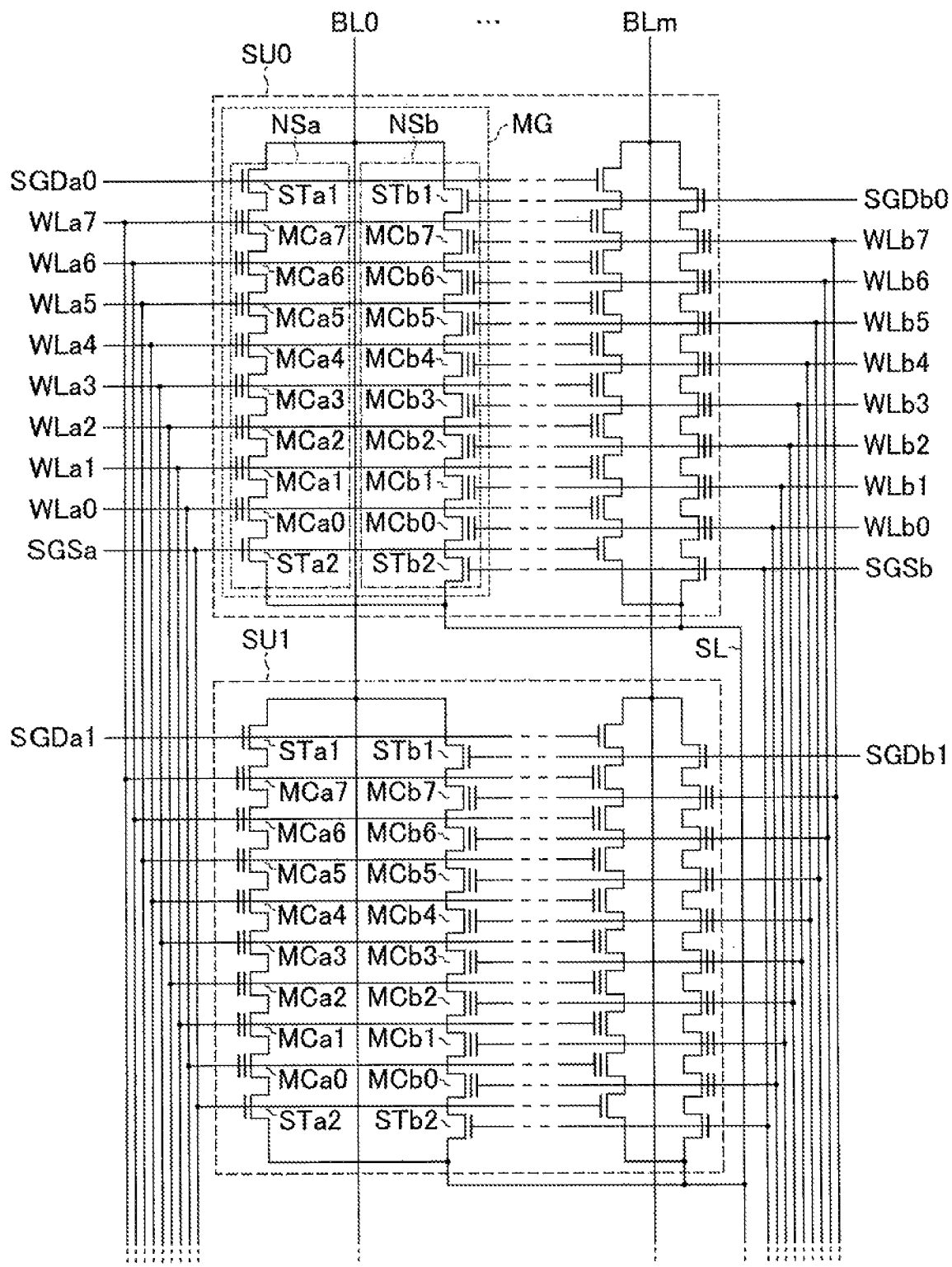
FIG. 2 is a circuit diagram showing an example of a circuit configuration of a memory cell array included in the semiconductor memory device according to the first embodiment.

FIG. 2 shows an example of a circuit configuration of the memory cell array 10 included in the semiconductor memory device 1 according to the first embodiment. Each block BLK includes, for example, four string units SU0 to SU3. Two string units SU0 and SU1 included in the same block BLK are shown in FIG. 2.

As shown in FIG. 2, each string unit SU includes a plurality of memory groups MG. The memory groups MG are respectively associated with bit line BL0 to BLm (where m is an integer not less than 1), and each memory group MG includes two NAND strings NSa and NSb. Each NAND string NSa includes a plurality of memory cell transistors MCa0 to MCa7, and select transistors STa1 and STa2. Each NAND string NSb includes a plurality of memory cell transistors MCb0 to MCb7, and select transistors STb1 and STb2.

Each of the memory cell transistors MCa and MCb includes a control gate and a charge storage layer, and retains data in a non-volatile manner. The select transistors STa1 and STa2 are each used to select a string unit SU in various operations. An example of a specific connection state of elements in the memory groups MG will be explained below, focusing on one memory group MG.

In the NAND string NSa, the memory cell transistors MCa0 to MCa7 are coupled in series. The source of the select transistor STa1 is coupled to one end of the series of memory cell transistors MCa0 to MCa7. The other end of the series of memory cell transistors MCa0 to MCa7 is coupled to the drain of the select transistor STa2.

Similarly, in the NAND string NSb, the memory cell transistors MCb0 to MCb7 are coupled in series. The source of select transistor STb1 is coupled to one end of a series of memory cell transistors MCb0 to MCb7. The other end of the series of memory cell transistors MCb0 to MCb7 is coupled to the drain of the select transistor STb2.

The respective drains of the select transistors STa1 and STb1 are coupled in common to the bit line BL associated with the memory group MG. The respective sources of the select transistors STa2 and STb2 are coupled to the source line SL.

The respective gates of the plurality of select transistors STa1 included in the same block BLK are coupled to a common select gate line SGDa in each string unit SU. Specifically, the select transistors STa1 included in the string unit SU0 are coupled in common to a select gate line SGDa0. The select transistors STa1 included in the string unit SU1 are coupled in common to the select gate line SGDa1. Similarly, the select transistors STa1 included in the string units SU2 and SU3 (not shown) are coupled in common to the select gate lines SGDa2 and SGDa3, respectively.

Similarly, the respective gates of the plurality of select transistor STb1 included in the same block BLK are coupled to a common select gate line SGDb in each string unit SU. Specifically, the select transistors STb1 included in the string unit SU0 are coupled in common to a select gate line SGDb0. The select transistors STa1 included in the string unit SU1 are coupled in common to the select gate line SGDb1. Similarly, the select transistors STb1 included in the string units SU2 and SU3 (not shown) are coupled in common to the select gate lines SGDb2 and SGDb3, respectively.

The respective control gates of the memory cell transistors MCa0 to MCa7 included in the same block BLK are coupled in common to the respective word lines WLa0 to WLa7. The respective control gates of the memory cell transistors MCb0 to MCb7 included in the same block BLK are coupled in common to the respective word lines WLb0 to WLb7.

The respective gates of the plurality of select transistors STa2 in the same block BLK are coupled in common to the select gate line SGSa. The respective gates of the plurality of select transistors STb2 in the same block BLK are coupled in common to the select gate line SGSb.

In the circuit configuration of the memory cell array 10 explained above, the bit line BL is shared by the memory group MG (a set of NAND strings NSa and NSb) to which the same column address is allocated. The source line SL is, for example, shared by a plurality of blocks BLK. The word lines WLa and WLb, the select gate lines SGDa and SGDb, and the select gate lines SGSa and SGSb are each controlled independently by the row decoder module 15.

A set of memory cell transistors MCa coupled to a common word line WL in one string unit SU is referred to as a cell unit. Data is read and written in units of cell units, and the unit is referred to as a page.

Each of the numbers of the memory cell transistors MCa and MCb and the select transistors STa and STb that are included in each of the NAND string NSa and NSb may be determined as appropriate. The number of string units SU included in each block BLK may be determined as appropriate.

[1-1-3] Configuration of Memory Cell Array 10

Hereinafter, an example of the structure of the memory cell array 10 in the semiconductor memory device 1 according to the embodiment will be described in the drawings referred to in the following, an X direction corresponds to the extending direction of bit lines BL, a Y direction corresponds to the extending direction of word lines WL, and a Z direction corresponds to a direction perpendicular to the surface of a semiconductor substrate 20, which is used to form the semiconductor memory device 1. In the plan view, hatching is applied as appropriate for better viewability. The hatching applied to the plan view is not necessarily related to the materials or characteristics of the structural element to which the hatching is applied in the specification, elements such as an insulating layer (interlayer insulating film), an interconnect, a contact, etc. are omitted as appropriate for viewability of the drawings.

<Planar Layout of Memory Cell Array 10>

Figure 3:
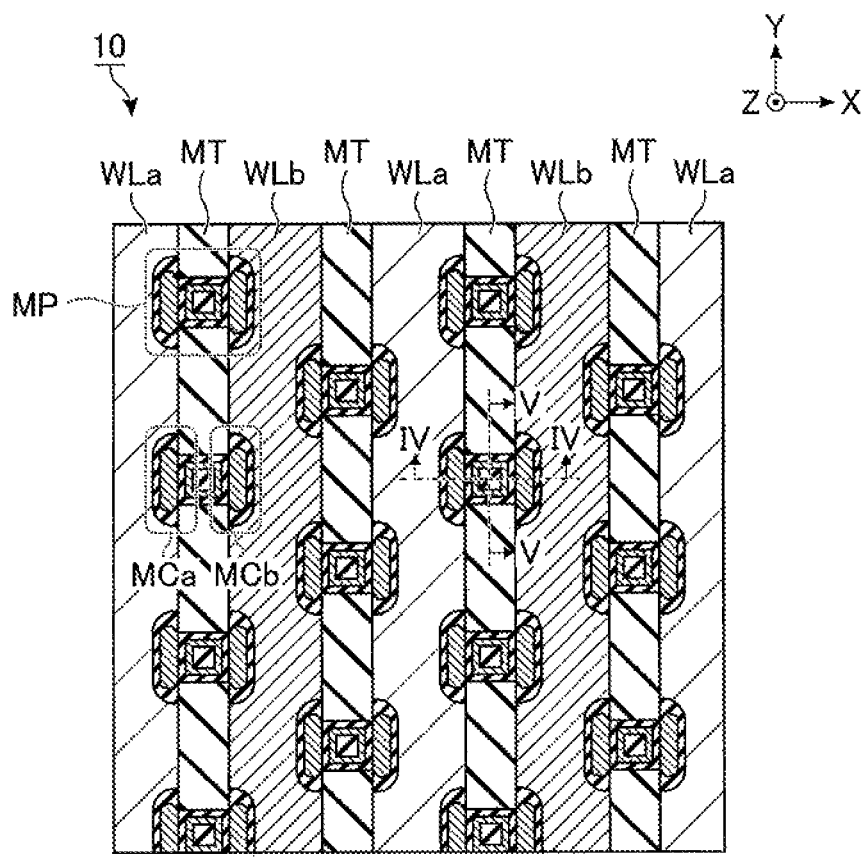
FIG. 3 is a plan view showing an example of a planar layout of the memory cell array included in the semiconductor memory device according to the first embodiment.

Hereinafter, an example of the structure of the memory cell array 10 in the semiconductor memory device 1 according to the first embodiment will be described with reference to FIG. 3. FIG. 3 shows an example of a structure of the memory pillar MP in a cross-section which is parallel to the surface of the semiconductor substrate 20 and includes the word lines WLa and WLb. As shown in FIG. 3, the memory cell array 10 includes the word lines WLa and WLb, memory trenches MT, and memory pillars MP.

Each of the word line WLa and WLb has a portion extending in the Y direction. The word lines WLa and WLb are arranged alternately in the X direction. Although not shown in the drawings, the select gate lines SGSa and SGSb are respectively overlaid on the word lines WLa and WLb. Similarly, the select gate lines SGDa and SGDb are respectively overlaid on the word lines WLa and WLb.

Each memory trench MT is interposed between the adjacent word lines WLa and WLb. Each memory trench MT is also interposed between the adjacent select gate lines SGSa and SGSb, and between the adjacent select gate lines SGDa and SGDb. Each of the memory trenches MT has a portion extending in the Y direction, and separates the adjacent interconnection layers in the X direction. The memory trench MT is filled with, for example, an insulator.

The memory pillars MP, each functioning as one memory group MG, are arranged, for example, in a staggered manner. Each memory pillar MP is arranged to overlap one memory trench MT, and divides the overlapped memory trench MT in the Y direction. Furthermore, each memory pillar MP is in contact with the word lines WLa and WLb adjacent to the memory trench MT that is overlapped with that memory pillar MP. Similarly, each memory pillar MP is in contact with the adjacent select gate lines SGSa and SGSb and select gate lines SGDa and SGDb adjacent to the memory trench MT that is overlapped with that memory pillar MP.

The memory cell transistor MCa is formed in a part between the memory pillar MP and the word line WLa. The memory cell transistor MCb is formed in a part between the memory pillar MP and the word line WLb. A part between the memory pillar MP and the select gate line SGSa functions as the select transistor STa2, and a part between the memory pillar MP and the select gate line SGSb functions as the select transistor STb2. A part between the memory pillar MP and the select gate line SGDa functions as the select transistor STa1, and a part between the memory pillar MP and the select gate line SGDb functions as the select transistor STb1.

In the planar layout of the memory cell array 10 described above, each memory pillar MP is overlaid by at least one bit line BL. Although not shown in the drawings, the bit lines BL, each having a part extending in the X direction, are arranged side by side in the Y direction. The memory pillar MP and the bit line BL that is associated with the memory pillar MP are electrically coupled.

<Cross-sectional Structure of Memory Cell Array 10>

Hereinafter, an example of the structure of the memory cell array 10 in the semiconductor memory device 1 according to the first embodiment will be described with reference to FIG. 4 and FIG. 5. FIG. 4 is a cross-sectional view taken along line IV-IV of FIG. 3, and shows an example of a structure of the memory pillar MP in a cross-section which is perpendicular to the surface of the semiconductor substrate 20 and includes a stacked interconnect structure. FIG. 5 is a cross-sectional view taken along line V-V of FIG. 3, and shows an example of a cross-sectional structure of the memory cell array 10 including a part of the memory trench MT and the memory pillar MP.

The memory cell array 10 includes, for example, conductive layers 24a, 24b, 26a, 26b, 28a, and 28b, insulating layers 21, 23, 25, 27, and 29, and a plurality of contacts CV. Details of the cross-sectional structure of the memory cell array 10 will be described sequentially from the lowermost layer.

The conductive layer 22 is provided above the semiconductor substrate 20 with the insulating layer 21 interposed therebetween. Although not shown in the drawings, circuits, such as a sense amplifier module 16, are provided inside the insulating layer 21. For example, the conductive layer 22 is formed in a plate-like shape extending along the XY plane, and is used as a source line SL. The conductive layer 22 includes, for example, silicon (Si) doped with phosphorus (P). The conductive layer 22 may contain a plurality of kinds of semiconductor layers or metal layers.

The conductive layer 24 is provided above the conductive layer 22 with the insulating layer 23 interposed therebetween. For example, the conductive layer 24 is formed in a plate-like shape extending along the XY plane, and is used as a select gate line SGS. The conductive layer 22 contains, for example, tungsten (W).

The insulating layers 25 and the conductive layers 26 are alternately stacked above the conductive layer 24. The stacked conductive layers 26 are used as the word lines WL0 to WL7 in order from the side of the semiconductor substrate 20. The conductive layers 26 contain, for example, tungsten (W).

Above the topmost conductive layer 26, a conductive layer 28 is provided with an insulating layer 27 interposed therebetween. For example, the conductive layer 28 is formed in a plate-like shape extending along the XY plane, and is used as a select gate line SGD. The conductive layer 28 contains, for example, tungsten (W).

A conductive layer 30 is provided above the conductive layer 28 with an insulating layer 29 interposed therebetween. For example, the conductive layers 30, each extending in the X direction, are arranged in the Y direction. The conductive layers 30 are used as the bit lines BL. The conductive layer 30 contains, for example, copper (Cu).

The memory trench MT divides the conductive layers 24, 26, and 28, and the insulating layers 23, 25, and 27. The memory trench MT is filled with an insulator 31. The top end of the insulator 31 is in contact with the insulating layer 29. The bottom end of the insulator 31 is in contact with the conductive layer 22. The memory trench MT may be filled with a plurality of kinds of materials, and may suffice to insulate at least adjacent conductive layers from each other.

As a result, the conductive layer 24 is divided into the conductive layers 24a and 24b respectively corresponding to the select gate lines SGSa and SGSb. The conductive layer 26 is divided into the conductive layers 26a and 26b respectively corresponding to the word lines WLa and WLb. The conductive layer 28 is divided into the conductive layers 28a and 28b respectively corresponding to the select gate lines SGDa and SGDb.

The memory pillar MP extends along the Z direction, and divides the conductive layers 24, 26, and 28, the insulating layers 21, 23, 25, and 27, and the memory trench MT. The top end and the bottom end of the memory pillar MP are aligned with the top end and the bottom end of the memory trench MT. Each of the memory pillars MP includes, for example, a core member 40, a semiconductor layer 41, a tunnel insulating film 42, conductive films 43a and 43b, and block insulating films 44a and 44b.

The core member 40 in the memory pillar MP extends in the Z direction, and is provided in a central portion of the memory pillar MP. The top end of the core member 40 is included in a layer above the conductive layer 28. The bottom end of the core member 40 is included in a layer below the conductive layer 24. The semiconductor layer 41 is provided around the core member 40. The tunnel insulating film 42 covers at least the side surface of the semiconductor layer 41.

The conductive film 43a and the block insulating film 44a are provided between the tunnel insulating film 42 and each of the conductive layers 24a, 26a, and 28a. The conductive film 43b the block insulating film 44b are provided between the tunnel insulating film 42 and each of the conductive layers 24b, 26b, and 28b. The conductive films 43a and 43b are each in contact with the tunnel insulating film 42. The conductive films 43a and 43b are respectively covered with the block insulating films 44a and 44b excluding the parts that are in contact with the tunnel insulating film 42. The block insulating film 44a is in contact with the conductive layer 24a, 26a or 28a. The block insulating film 44b is in contact with the conductive layer 24b, 26b or 28b.

A column-like contact CV is provided on top of the semiconductor layer 41 in the memory pillar MP. A top surface of the contact CV is in contact with one conductive layer 30 (bit line BL). The memory pillars MP corresponding to the memory groups MG associated with the same column address are coupled in the common conductive layer 30 via the contacts CV.

In the structure of the memory pillar MP explained above, a portion facing the conductive layer 26a (word line WLa) in the memory pillar MP functions as the memory cell transistor MCa, and a portion facing the conductive layer 26b (word line WLb) in the memory pillar MP functions as the memory cell transistor MCb. Similarly, a portion facing the conductive layer 24a (select gate line SGSa) in the memory pillar MP functions as the select transistor STa2, and a portion facing the conductive layer 24b (select gate line SGSb) in the memory pillar MP functions as the select transistor STb2. A portion facing the conductive layer 28a (select gate line SGDa) in the memory pillar MP functions as the select transistor STa1, and a portion facing the conductive layer 28b (select gate line SGDb) in the memory pillar MP functions as the select transistor STb1.

Thus, in the semiconductor memory device 1 according to the first embodiment, the memory cell transistors MCa and MCb respectively use the conductive films 43a and 43b as charge storage layers. In other words, each of the memory cell transistors MCa and MCb is a floating gate type memory cell transistor. The memory cell transistors MCa and MCb and the select transistors STa1, STb1, STa2, and STb2 share the semiconductor layer 41 (channel). A set of the select transistors STa1 and STa2 and the memory cell transistors MCa0 to MCa7 arranged side by side in the Z direction correspond to the NAND string NSa. A set of the select transistors STb1 and STb2 and the memory cell transistors MCb0 to MCb7 arranged side by side in the Z direction correspond to the NAND string NSb.

The memory cell transistors MCa0 to MCa7 and the select transistors STa1 and STa2 respectively face the memory cell transistors MCb0 to MCb7 and the select transistors STb1 and STb2, in a direction parallel to the surface of the semiconductor substrate 20 (for example, the X direction). In other words, the memory cell transistors MCa0 to MCa7 and the select transistors STa1 and STa2 are respectively adjacent to the memory cell transistors MCb0 to MCb7 and the select transistors STb1 and STb2 via regions divided by the memory trench MT.

<Details of Cross-Sectional Structure of Memory Pillar MP>

Figure 6:
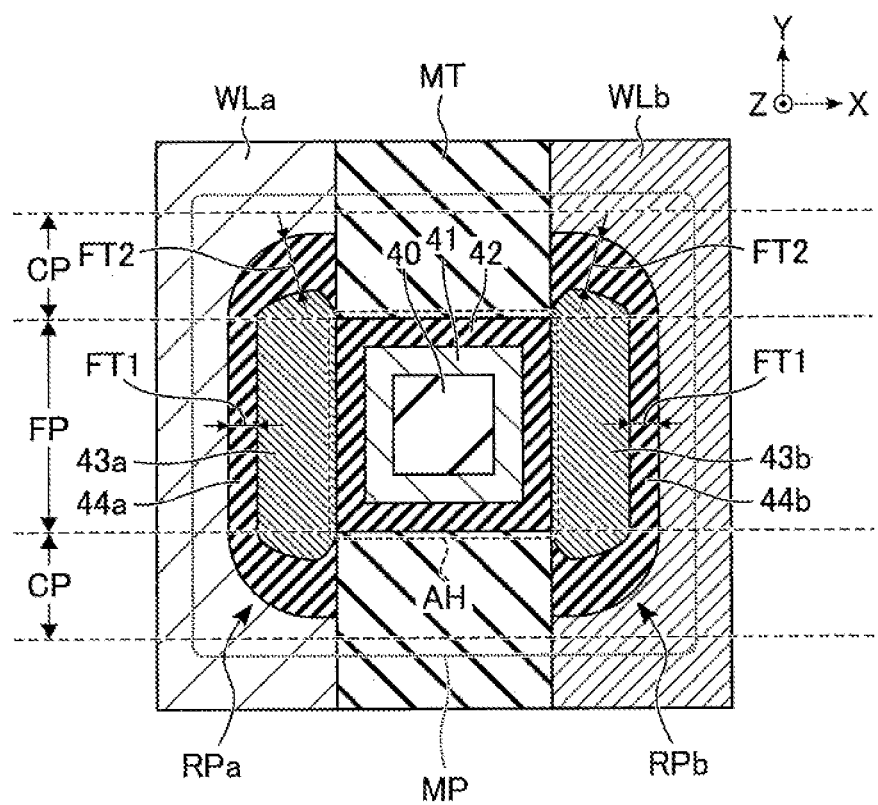
FIGS. 6 to 8 are cross-sectional views showing examples of cross-sectional structures of a memory pillar included in the semiconductor memory device according to the first embodiment.

FIG. 6 shows an example of details of the cross-sectional structure of the memory pillar MP included in the semiconductor memory device according to the first embodiment, and extracts a cross-section which is parallel to the surface of the semiconductor substrate 20 and includes the word lines WLa and WLb.

As shown in FIG. 6, the core member 40, the semiconductor layer 41, and the tunnel insulating film 42 in the memory pillar MP are provided in a memory hole AH that divides the memory trench MT in the Y direction. The conductive film 43a and the block insulating film 44a in the memory pillar MP are provided on the word line WLa side of the regions divided by the memory hole AH and the memory trench MT (hereinafter referred to as a recessed portion RPa). The conductive film 43b and the block insulating film 44b in the memory pillar MP are provided on the word line WLb side of the regions divided by the memory hole AH and the memory trench MT (hereinafter referred to as a recessed portion RPb).

The shape of the memory hole AH is, for example, a rectangle in the plan view. The core member 40 is provided in the central portion of the memory hole AH. The semiconductor layer 41 surrounds the core member 40. The tunnel insulating film 42 surrounds the semiconductor layer 41. The tunnel insulating film 42 is in contact with the insulator in the memory trench MT, for example, in the Y direction.

The recessed portion RPa has a shape, for example, isotropically expanding from the memory hole AH into the word line WLa in the plan view. The recessed portion RPb has a shape, for example, isotropically expanding from the memory hole AH into the word line WLb in the plan view. Each of the areas of the recessed portions RPa and RPb includes, for example, a flat part FP and curved parts CP. The flat part PP faces the memory hole AR in the X direction. The curved parts CP face the memory trench MT in the X direction.

In the recessed portion RPa, the conductive film 43a is in contact with the tunnel insulating film 42 in the X direction. The conductive film 43a is covered with the block insulating film 44a, for example, excluding the part that is in contact with the tunnel insulating film 42. The conductive film 43a and the word line WLa are isolated from each other with the block insulating film 44a interposed therebetween. A part of the block insulating film 44a is in contact with the insulator in the memory trench MT.

Similarly, in the recessed portion RPb, the conductive film 43b is in contact with the tunnel insulating film 42 in the X direction. The conductive film 43b is covered with the block insulating film 44b, for example, excluding the part that is in contact with the tunnel insulating film 42. The conductive film 43b and the word line WLb are isolated from each other with the block insulating film 44b interposed therebetween. A part of the block insulating film 44b is in contact with the insulator in the memory trench MT.

For example, in the flat part FP, the block insulating films 44a and 44b, each extending in the Y axis, are provided in parallel. Furthermore, in the flat part FP, each of the block insulating films 44a and 44b has a substantially uniform thickness. In the curved parts CP, the block insulating films 44a and 44b are curved. The thickness FT2 of the block insulating film 44 in the curved parts CP is greater than the thickness FT1 of the block insulating film 44 in the flat part FP.

Figure 7:
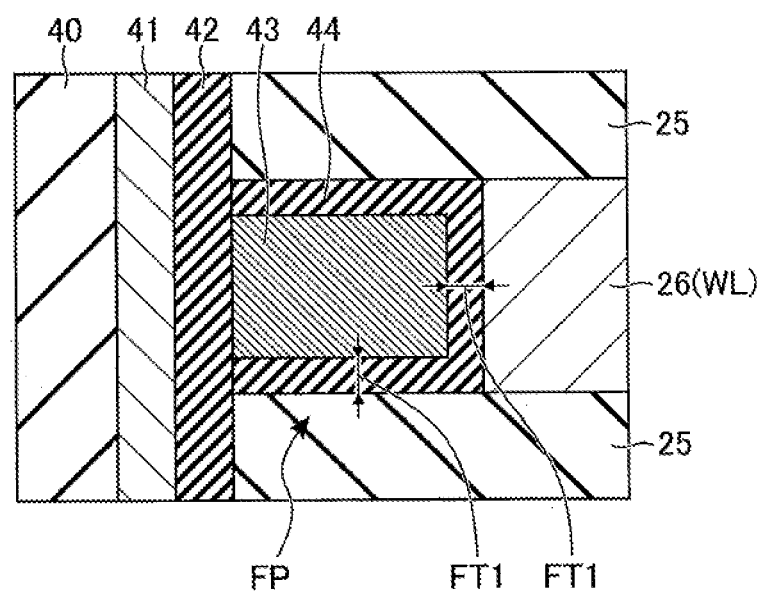

FIG. 7 shows an example of a cross section along the Z direction including the flat part FP of FIG. 6. As shown in FIG. 7, the block insulating film 44 in the flat part FP is formed, for example, to have the same thickness FT1 also in the part between the conductive film 43 and the insulating layer 25. In other words, in the flat part FP, the thickness of the block insulating film 44 between the insulating layer 25 and the conductive film 43 and the thickness of the block insulating film 44 between the conductive layer 26 and the conductive layer 43 are, for example, substantially uniform.

Figure 8:
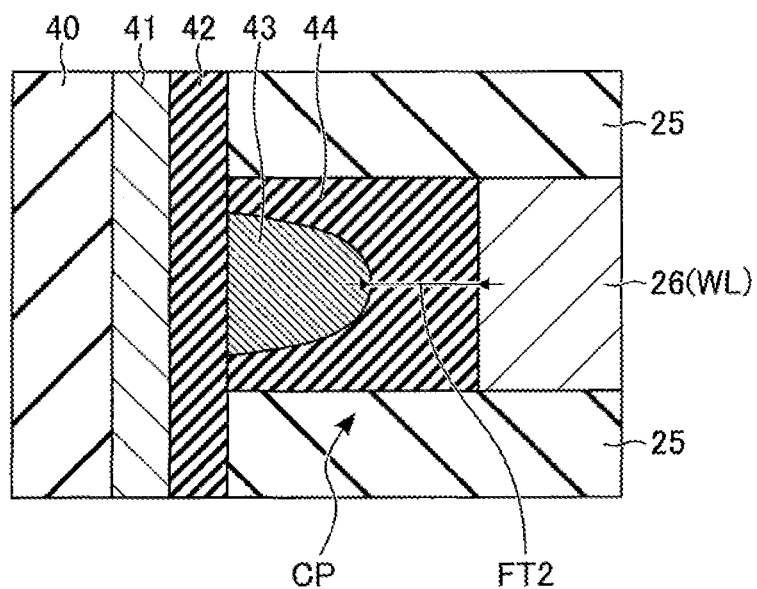

FIG. 8 shows an example of a cross section along the Z direction including the curved part CP of FIG. 6. As shown in FIG. 8, the block insulating film 44 in the curved part CP is formed, for example, to be thinner toward the tunnel insulating film 42 and thicker toward the conductive layer 26. As a result, in the curved part CP, the block insulating film 44 between the conductive film 43 and the conductive layer 26 is provided with a part having the thickness FT2.

In the configuration of the memory pillar MP described above, the conductive layers 43a adjacent to each other in the Z direction are separate from each other, and the conductive layers 43b adjacent to each other in the Z direction are separate from each other. In the two memory pillars MP adjacent to each other in the Y direction, the block insulating films 44a and 44b in one memory pillar MP are respectively separate from the block insulating films 44a and 44b in the other memory pillar MP.

In the configuration of the memory pillar MP described above, the core member 40 contains an insulator, such as silicon oxide ($SiO_2$). The semiconductor layer 41 contains, for example, silicon (Si). Each of the tunnel insulating film 42 and the block insulating films 44a and 44b contain, for example, silicon oxide ($SiO_2$). A material other than silicon oxide ($SiO_2$) may be used to form the block insulating films 44a and 44b. A semiconductor or metal, for example, may be used to form the conductive films 43a and 43b. The conductive films 43a and 43b are formed of, for example, polysilicon.

[1-2] Method of Manufacturing Semiconductor Memory Device 1

Figure 9:
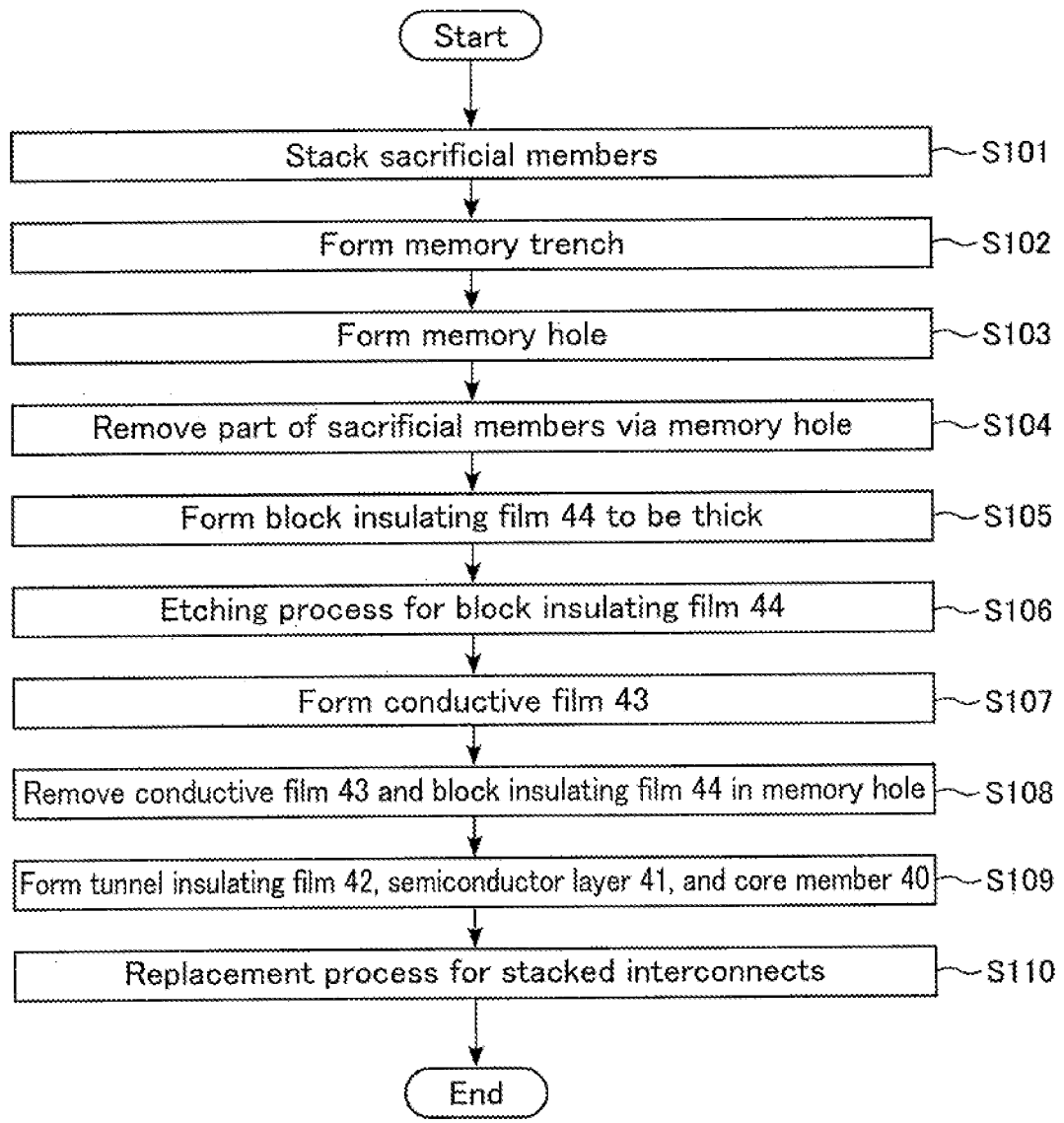
FIG. 9 is a flowchart showing an example of a manufacturing method of the semiconductor memory device according to the first embodiment.

With reference to FIG. 9, a description will be given of an example of a series of manufacturing steps regarding formation of the stacked interconnect structure inside the memory cell array 10 in the semiconductor memory device 1 according to the first embodiment. FIG. 9 is a flowchart showing an example of a manufacturing method of the semiconductor memory device according to the first embodiment. FIGS. 10 to 19 each show an example of the cross-section structure in the middle of manufacturing the semiconductor memory device 1 according to the first embodiment. The lower part of each of FIGS. 10 to 19 corresponds to a cross section of the region shown in FIG. 4, and the upper part of each of FIGS. 10 to 19 corresponds to a cross section taken along line A1-A2 in that figure.

First, as shown in FIG. 10, a plurality of sacrificial members 51, which correspond to interconnects, are stacked, (step S101). Specifically, the insulating layer 21, which includes a circuit corresponding to the sense amplifier module 16, is formed on the semiconductor substrate 20. The conductive layer 22 is formed on the insulating layer 21. Above the conductive layer 22, a sacrificial member 50 is provided with the insulating layer 23 interposed therebetween. The insulating layers 25 and the sacrificial members 51 are alternatively stacked one by one on the sacrificial member 50. A sacrificial member 52 and the insulating layer 29 are sequentially formed on the uppermost insulating layer 25. The sacrificial member 51 is formed of, for example, silicon nitride (SiN).

Figure 11:
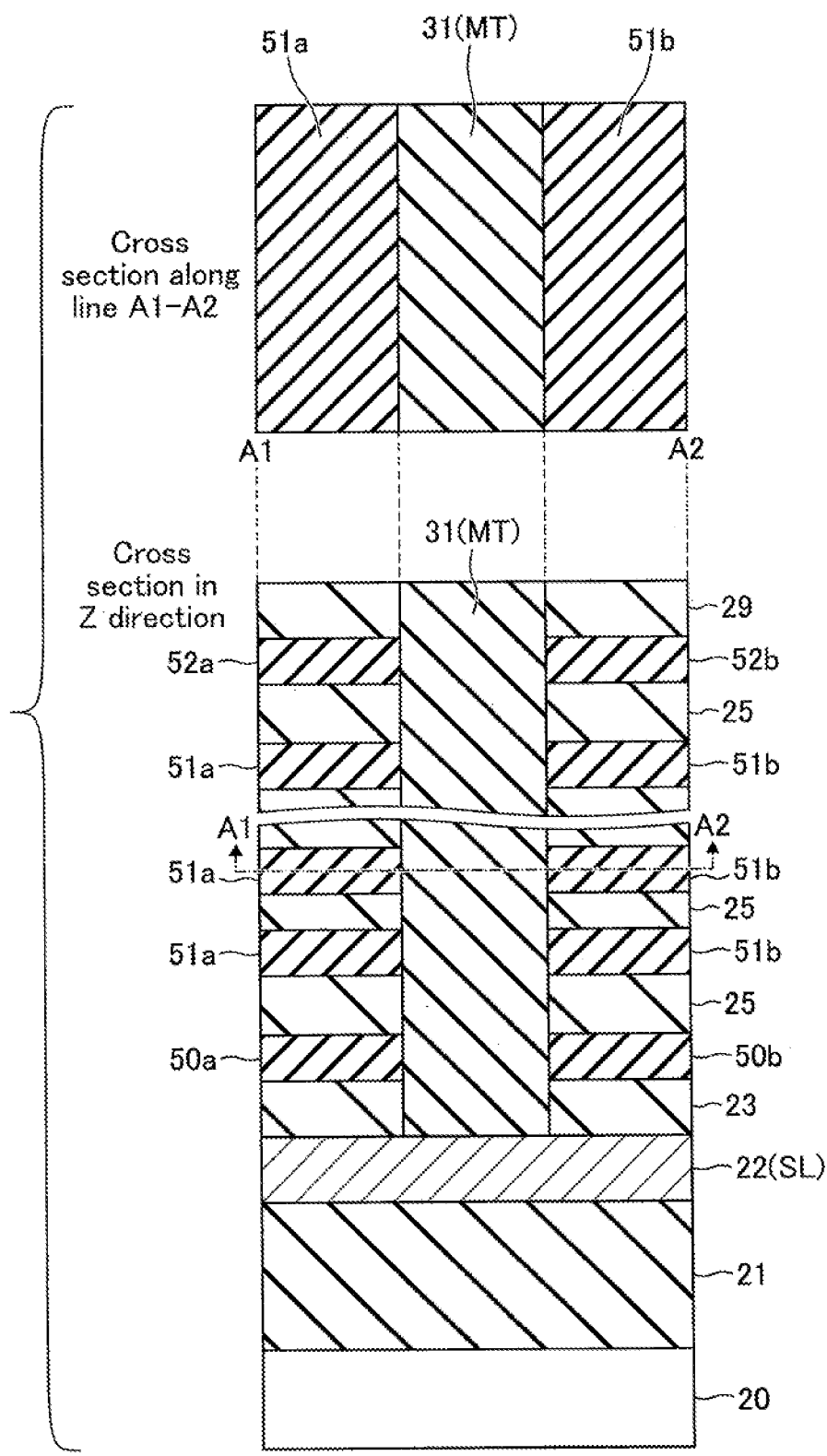

Next, as shown in FIG. 11, the insulator 31 corresponding to the memory trench MT is formed (step S102). Specifically, first, a mask in which a region corresponding to the memory trench MT is opened is formed by photolithography, etc. Then, the memory trench MT is formed by anisotropic etching using the formed mask. In this step, the memory trench MT divides the insulating layers 23, 25 and 29, and the sacrificial members 50 to 52, and at the bottom of the memory trench MT, a part of the conductive layer 22 is exposed. The sacrificial members 50 to 52 are divided into the sacrificial members 50a and 50b, the sacrificial members 51a and 51b, and the sacrificial members 52a and 52b by the memory trench MT. The anisotropic etching in the present process is, for example, reactive ion etching (RIE). Thereafter, the memory trench MT is filled with insulating film, and the upper surface of the insulating film is flattened by, for example, chemical mechanical polishing (CMP). Thus, as shown in FIG. 11, the insulator 31 is formed in the memory trench MT.

Figure 12:
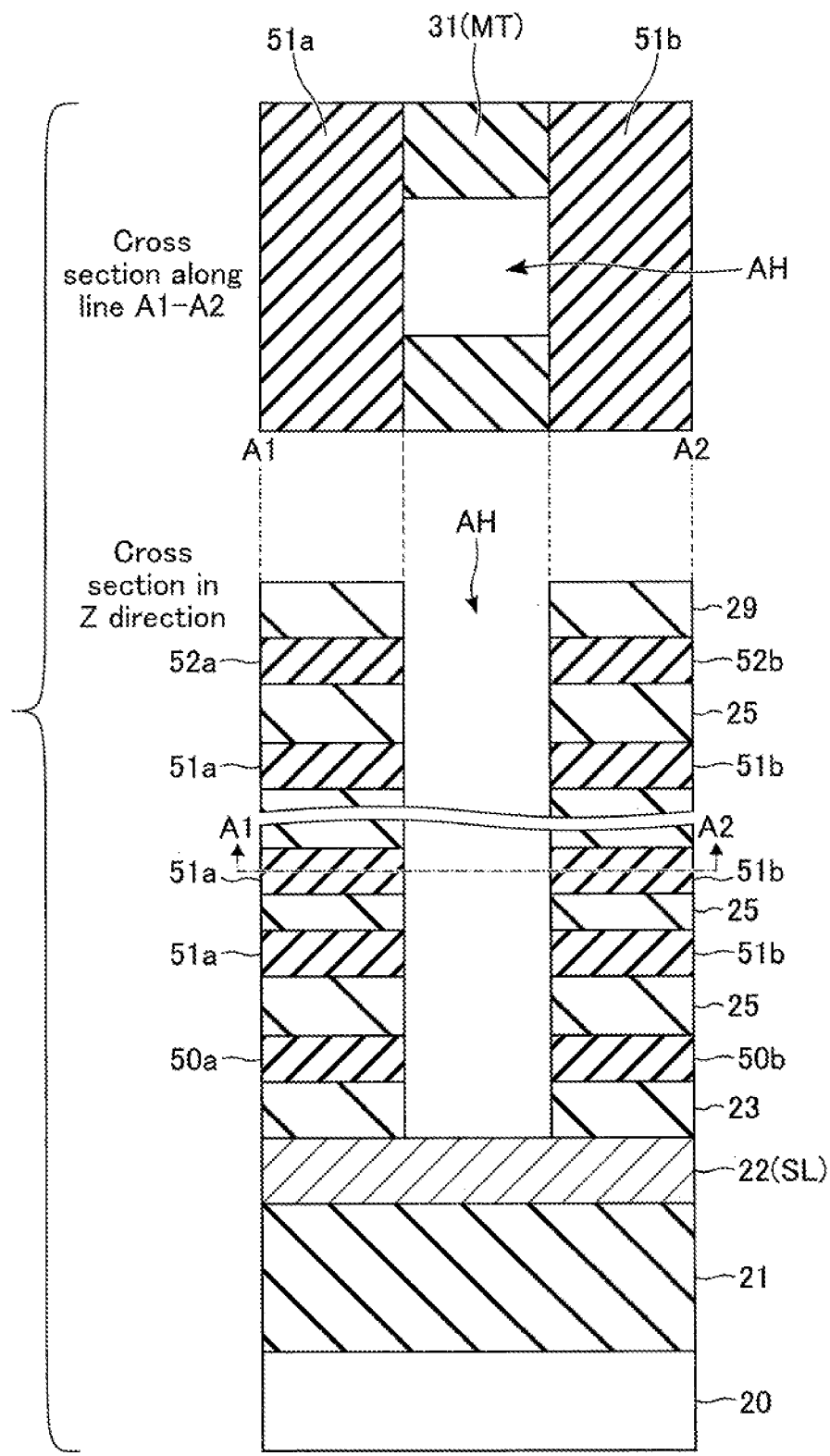

Next, as shown in FIG. 12, the memory hole AH corresponding to the memory pillar MP is formed (step S103). Specifically, first, a mask is formed by photolithography, etc. in which an area corresponding to the memory pillar MP is opened. Then, by anisotropic etching using the formed mask, the memory hole AR is formed. In this step, at the memory hole AH passes through the memory trench MT. At the side surface in the memory hole AH, the respective sides of the sacrificial members 50a and 50b, the sacrificial members 51a and 51b, and the sacrificial members 52a and 52b are exposed, the paired members being adjacent with the memory trench MT interposed therebetween. At the bottom in the memory hole, AH, a part of the conductive layer 22 is exposed. The anisotropic etching in the present process is, for example, RIE. In the etching of this process, parts of the respective insulating layers 23, 25, and 29, sacrificial members 50a and 50b, sacrificial members 51a and 51b, and sacrificial members 52a and 52b may be removed.

Figure 13:
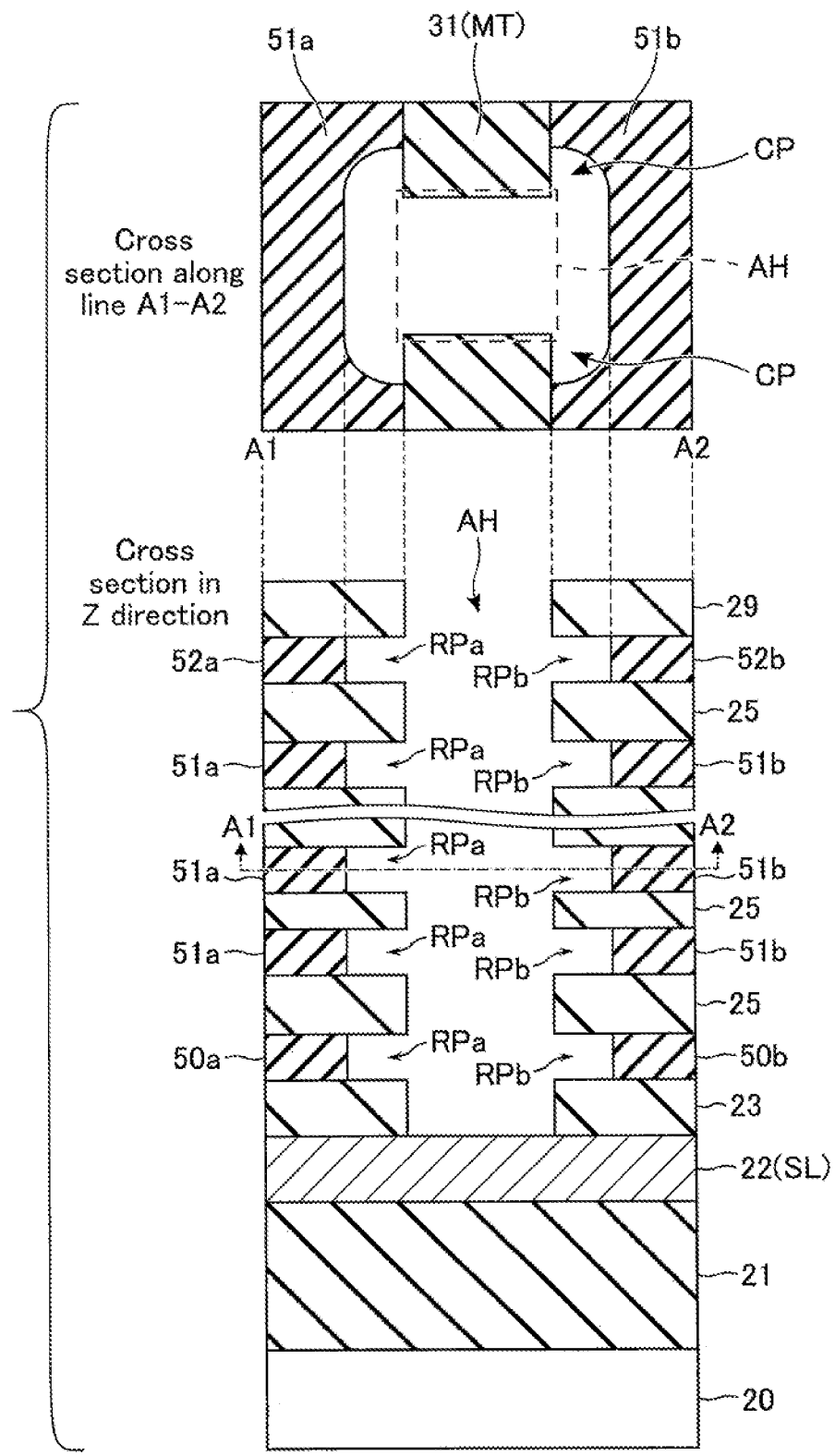

Next, wet etching using the memory hole AH is performed. As a result, the parts of the respective sacrificial members 50a and 50b, sacrificial members 51a and 51b, and sacrificial members 52a and 52b exposed at the side surface in the memory hole AH are removed (step S104). Accordingly, as shown in FIG. 13, the side surface in the memory hole AH is processed into a recessed shape in the parts where the sacrificial members 50a and 50b, the sacrificial members 51a and 51b, and the sacrificial members 52a and 52b have been removed. In this step, the removed parts of the sacrificial members 50a, 51a, and 52a correspond to the recessed portion RPa, and the removed parts of the sacrificial members 50b, 51b, and 52b correspond to the recessed portion RPb.

Figure 14:
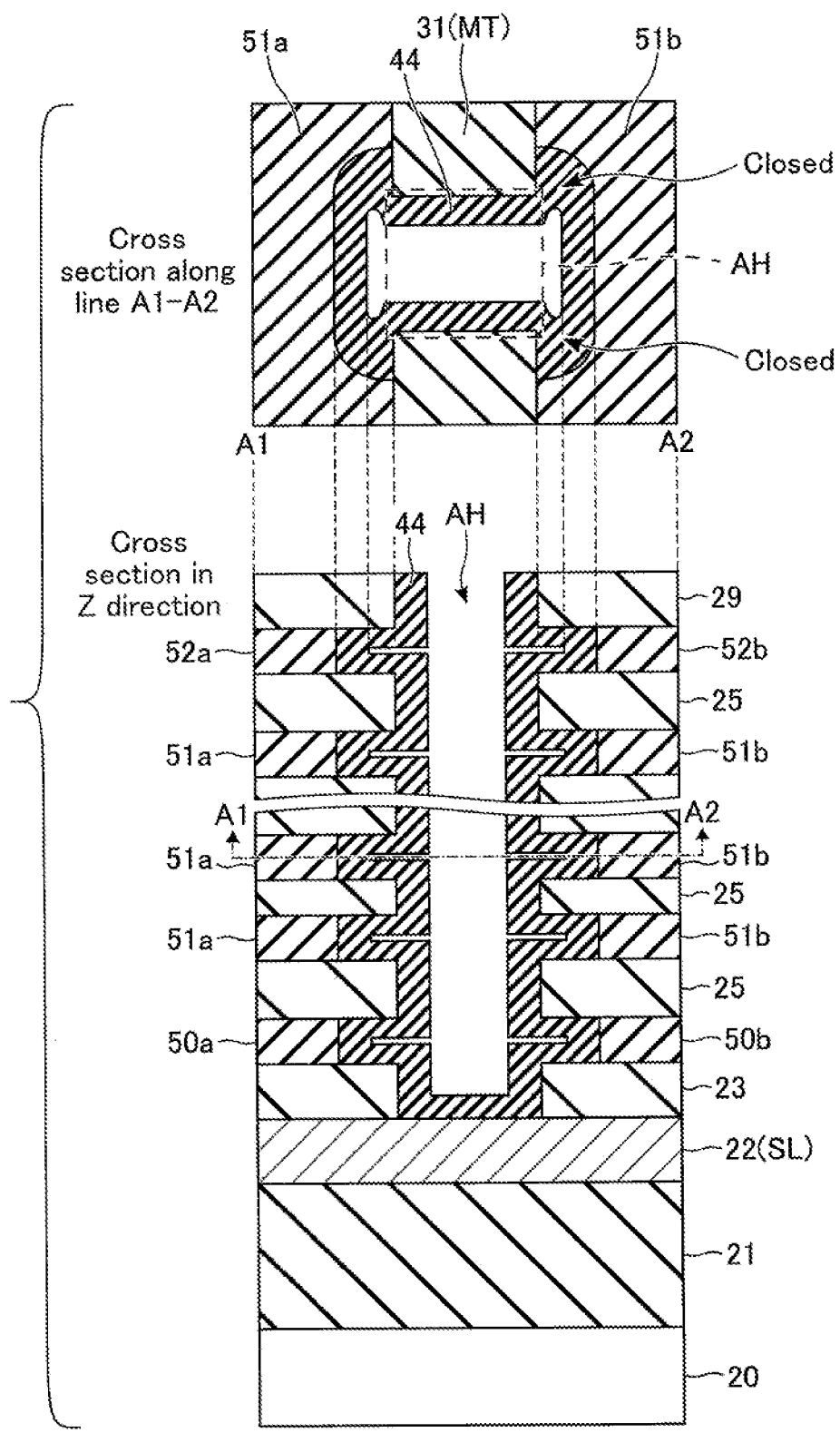

Then, as shown in FIG. 14, the block insulating film 44 is formed on the side surface and the bottom surface in the memory hole AR, and the exposed surfaces in the recessed portions RPa and RPb (step S105). In this step, the block insulating film 44 of the recessed portions RPa and RPb is formed to be thick, so that the parts corresponding to the curved parts CP are closed, and the parts corresponding to the flat parts FP are not closed.

Figure 15:
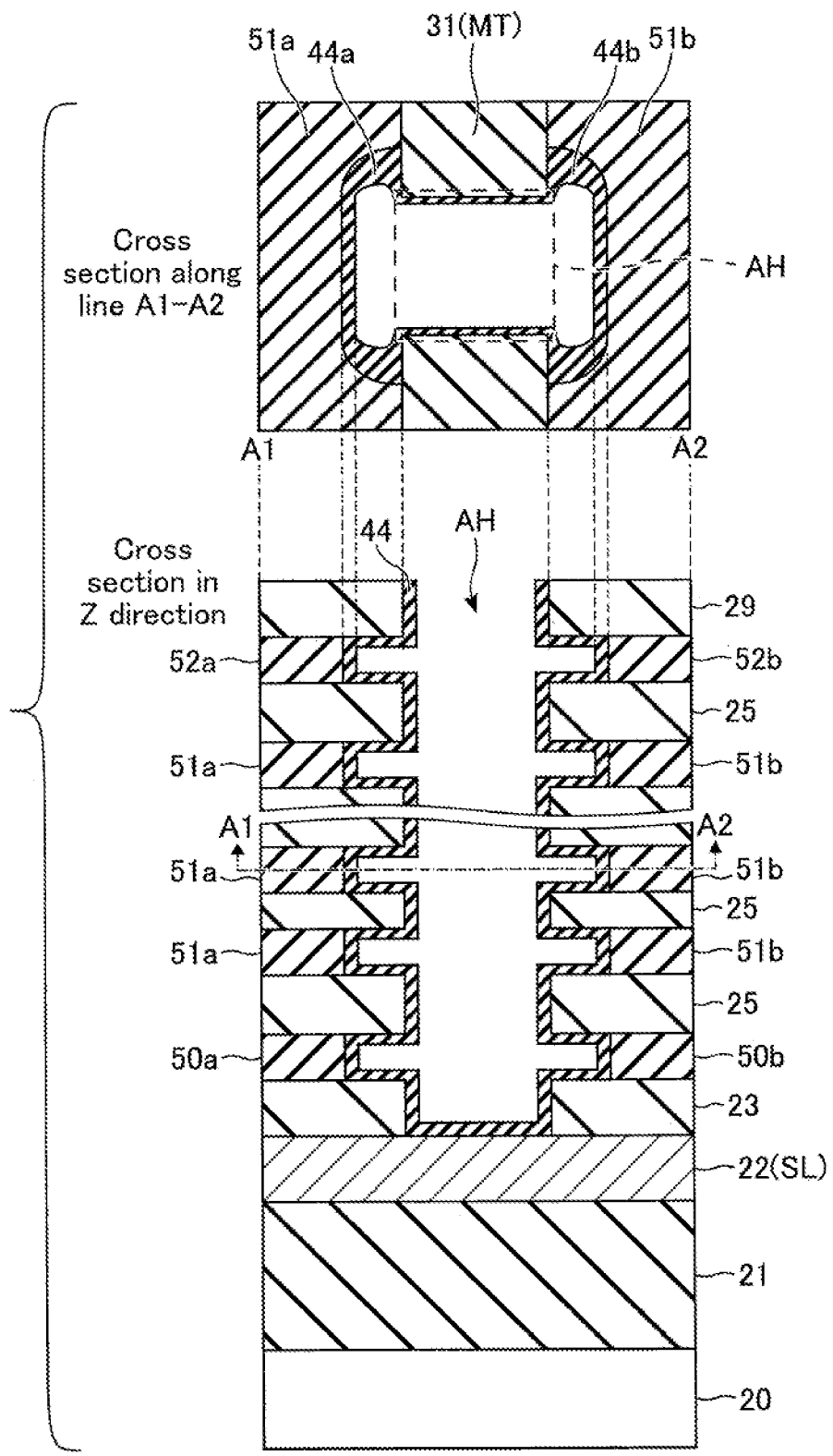

Next, as shown in FIG. 15, a part of the block insulating film 44 is removed by etching, so that the thickness in the flat parts FP becomes a desired thickness (step S106). As a result, the remaining part of the block insulating film 44 is thicker in the curved parts CP and thinner in the flat parts FP. At this time point, the thickness of the block insulating film 44 in the flat part FP corresponds to FT1, and the thickness of the block insulating film 44 in the curved parts CP corresponds to FT2.

As described above, in the processing of steps S105 and S106, the block insulating film 44 is first processed to be thick to close the curved parts CP, and thereafter to be a desired thickness in the flat parts FP. As a result, the thickness of the block insulating film 44 is greater in the curved parts CP than the thickness of the block insulating film 44 in the flat parts FP.

Figure 16:
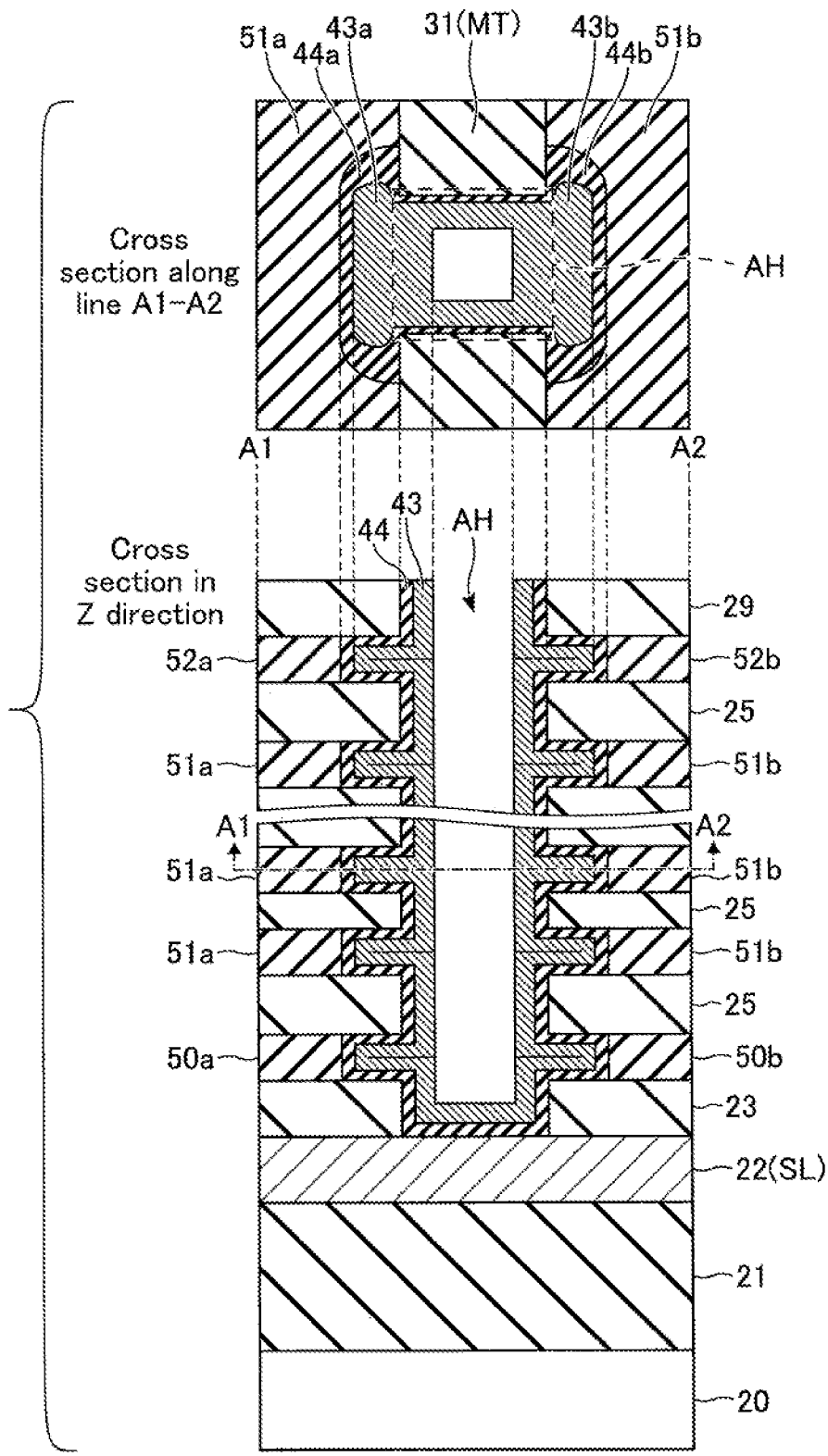

Next, as shown in FIG. 16, the conductive film 43 is formed to cover the block insulating film 44 on the side surface and the bottom surface in the memory hole AH, and to fill the recessed portions RPa and RPb which were partly opened in step S106 (step S107).

Figure 17:
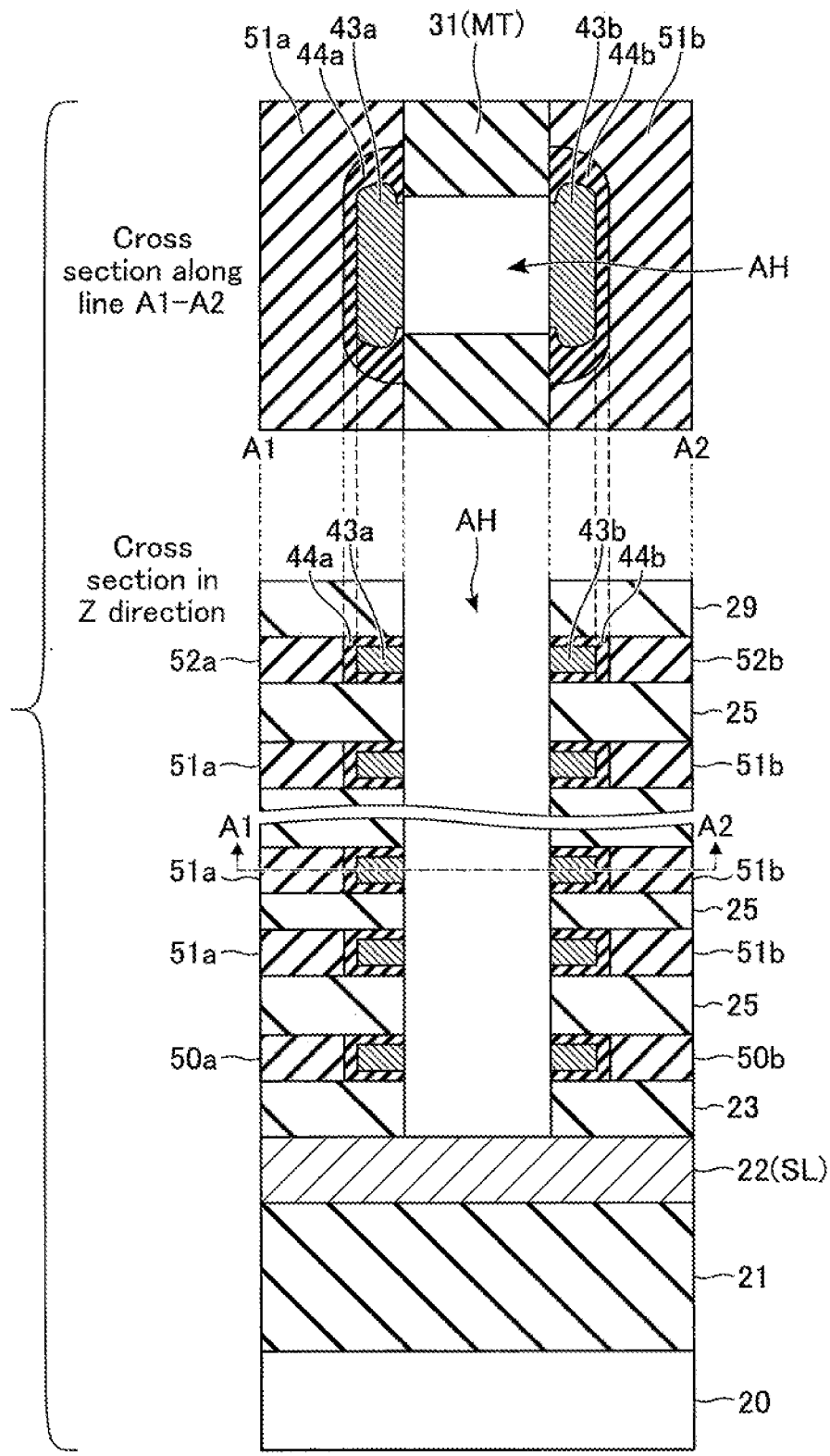

Next, as shown in FIG. 17, the conductive film 43 and the block insulating film 44 in the parts other than the recessed portions RPa and RPb in the memory hole AH are removed (step S108). Accordingly, a set of block insulating films 44a and conductive films 43a which are in contact with the sacrificial members 50a to 52a, and a set of block insulating films 44b and conductive films 43b which are in contact with the sacrificial members 50b to 52b, are formed.

Thereafter, the tunnel insulating film 42, the semiconductor layer 41, and the core member 40 are formed in order on the side and bottom surfaces in the memory hole AH, and the memory hole AH is filled up with the core member 40 (step S109). In this step, a part of the tunnel insulating film 42 which was provided on the bottom surface in the memory hole AH is removed before forming the semiconductor layer 41, and then the semiconductor layer 41 is formed to be in contact with the conductive layer 22 exposed at the bottom of the memory hole AH. Then, a part of the core member 40 formed in an upper part of the memory hole AH is removed, and the space is filled up with a semiconductor material (semiconductor layer 41). The tunnel insulating film 42 and the semiconductor layer 41 that remain above the insulating layer 29 in this step are removed by, for example, CMP. In this manner, as shown in FIG. 18, a structure corresponding to the memory pillar MP is formed inside the memory hole AH.

Figure 19:
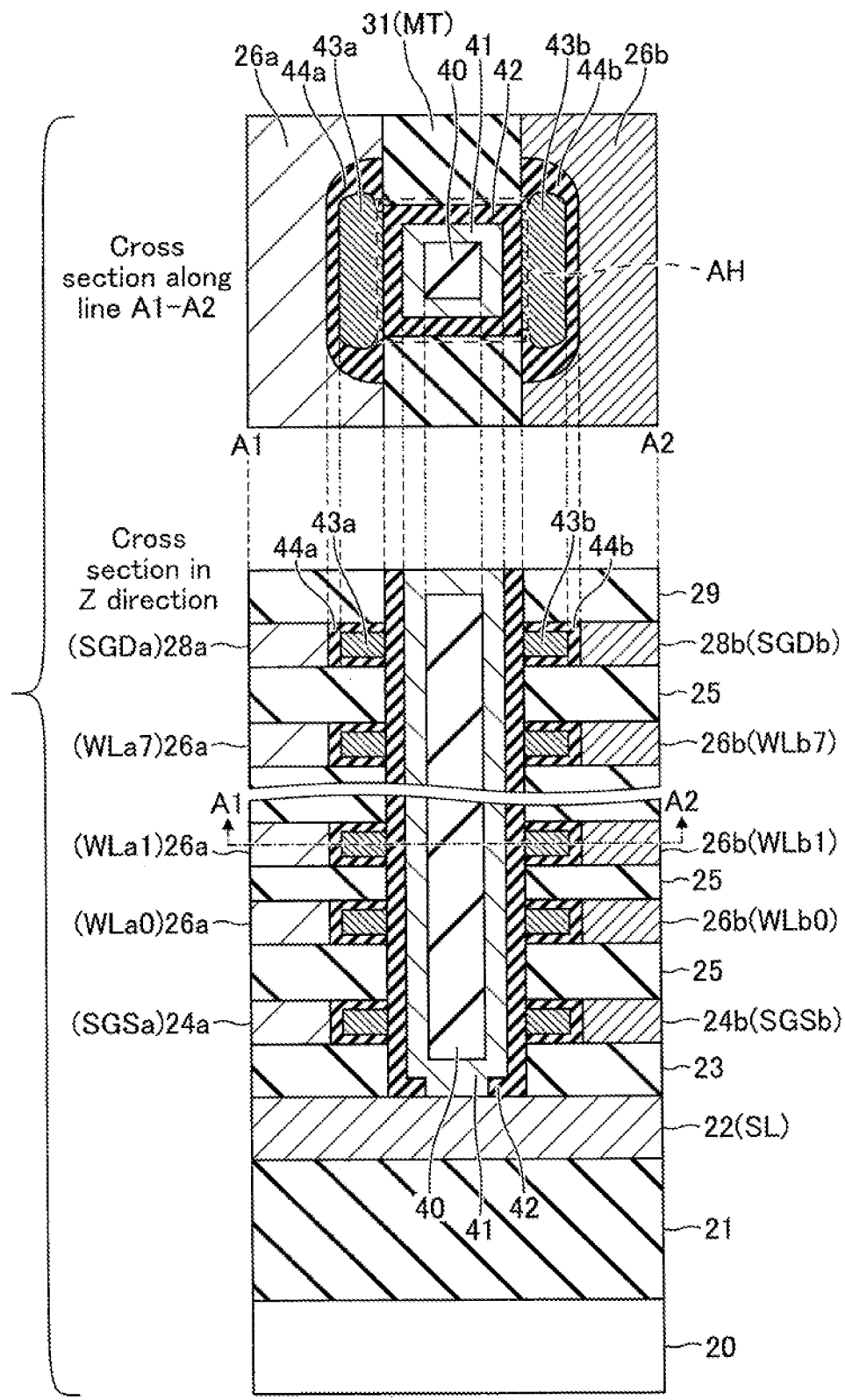

Next, the replacement process for the stacked interconnects is performed (step S110). Specifically, a slit or hole to expose the side surfaces of the sacrificial members 50a and 50b, the sacrificial members 51a and 51b, and the sacrificial members 52a and 52b is formed first. Then, the sacrificial members 50a and 50b, the sacrificial members 51a and 51b, and the sacrificial members 52a and 52b are removed by etching through the slit or hole. The space obtained as a result of removing each of the sacrificial members 50a and 50b, the sacrificial members 51a and 51b, and the sacrificial members 52a and 52b is filled with a conductor, and the conductor formed in the slit or hole is removed. Accordingly, as shown in FIG. 19, the conductive layers 24a, 24b, 26a, 26b, 28a, and 28b are formed. After the conductive layers 24a, 24b, 26a, 26b, 28a, and 28b are formed, the slit or hole formed in this step is filled with, for example, an insulator.

By the manufacturing processes of the semiconductor memory device 1 according to the first embodiment described above, the memory pillar MP, and the word lines WLa and WLb, the select gate lines SGSa, SGSb, SGDa, and SGDb coupled to the memory pillar MP, are formed. The manufacturing processes have been described as an example, and other processes may be inserted between the processes described.

[1-3] Advantages of First Embodiment

The semiconductor memory device 1 according to the first embodiment described above makes it possible to suppress a leak current of the memory cell transistors and to improve the reliability of data stored in the semiconductor memory device 1. Advantages of the semiconductor memory device 1 according to the first embodiment will be explained in detail below.

In the semiconductor memory device in which memory cell transistors are three-dimensionally stacked, a memory trench MT that divides the memory cell transistors MC or stacked interconnects may be formed. In this type of semiconductor memory device, one memory pillar MP can function as two NAND strings NSa and NSb by independently controlling the divided two stacked interconnects, such as word lines WL, which are in contact with the memory pillar MP. If the memory cell transistors MC have a floating structure, the charge storage layer (conductive film 43a or 43b) in the memory pillar MP of one memory cell transistor MC is separated from that of another memory cell transistor MC.

To increase the density of memory cells MC in the semiconductor memory device, the cell size may be reduced. However, if the cell size is reduced, the physical distance from the word line WL to the semiconductor layer 41 (channel) will be reduced. A phenomenon that may occur when the physical distance between the word line WL and the channel is reduced will be explained with reference to FIG. 20.

Figure 20:
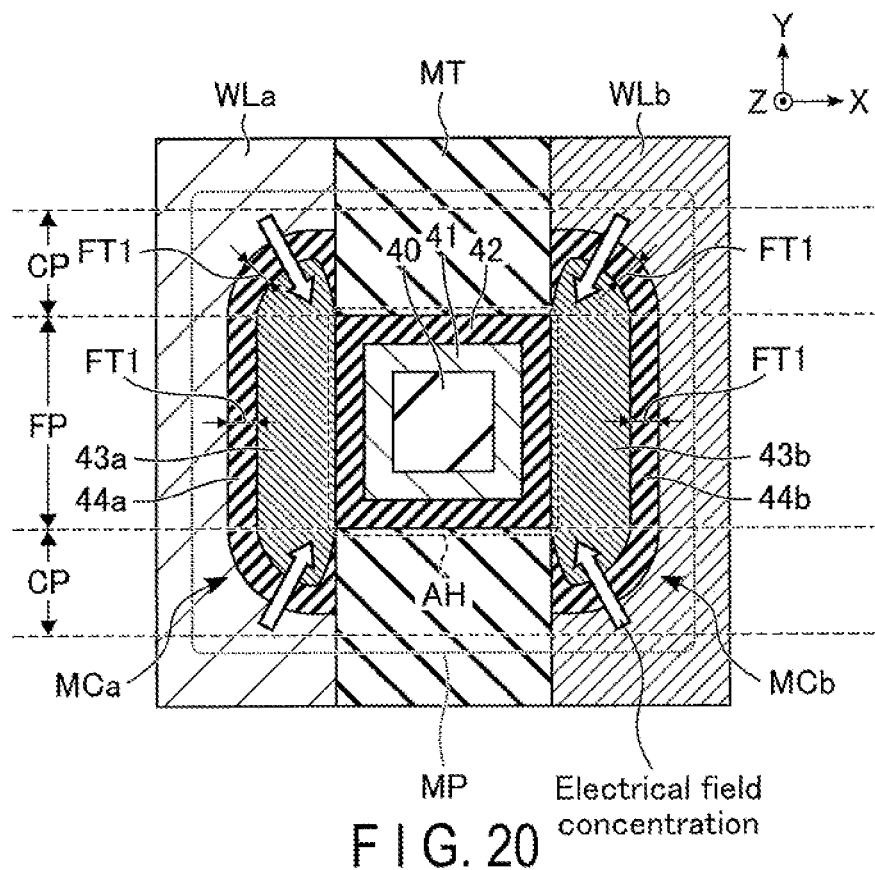
FIGS. 20 to 22 are cross-sectional views showing examples of cross-sectional structures of a memory pillar included in a semiconductor memory device according to second embodiment.

As shown in FIG. 20, when a gate voltage is applied to the word line WL, electrical field concentration may occur at a part corresponding to the curved part CP at which the conductive film 43 and the block insulating film 44 are curved. At that time, a high electrical field may be generated between the semiconductor layer 41 and the word line WL. If a high electrical field occurs, a leak current may be generated between the word line WL and the semiconductor layer 41 via the block insulating film 44, which essentially does not allow passage of a current. In this case, saturation characteristics of the memory cell transistor MC may be deteriorated.

In contrast, in the semiconductor memory device 1 according to the first embodiment, the memory cell transistor MC has a floating structure, and the part of the block insulating film 44 in which the electrical field concentration may occur is thick. Specifically, in the semiconductor memory device 1 according to the first embodiment, the thickness FT2 of the block insulating film 44 in the curved parts CP is greater than the thickness FT1 of the block insulating film 44 in the flat parts FP.

As a result, in the semiconductor memory device 1 according to the first embodiment, even if the electrical field concentration occurs in the curved part CP, a leak current flowing between the word line WL and the semiconductor layer 41 is suppressed by the thick block insulating film 44. Therefore, the semiconductor memory device 1 according to the first embodiment can suppress deterioration of the saturation characteristics of the memory cell transistor MC due to the leak current which may pass through the block insulating film.

[2] Second Embodiment

In the semiconductor memory device 1 according to the second embodiment, the block insulating films in the curved parts CP of the memory pillar MP have a structure different from that of the first embodiment. In the following, a description will be given of differences between the semiconductor memory device 1 according to the second embodiment and that of the first embodiment.

[2-1] Sectional Structure of Memory Pillar MP

Figure 21:
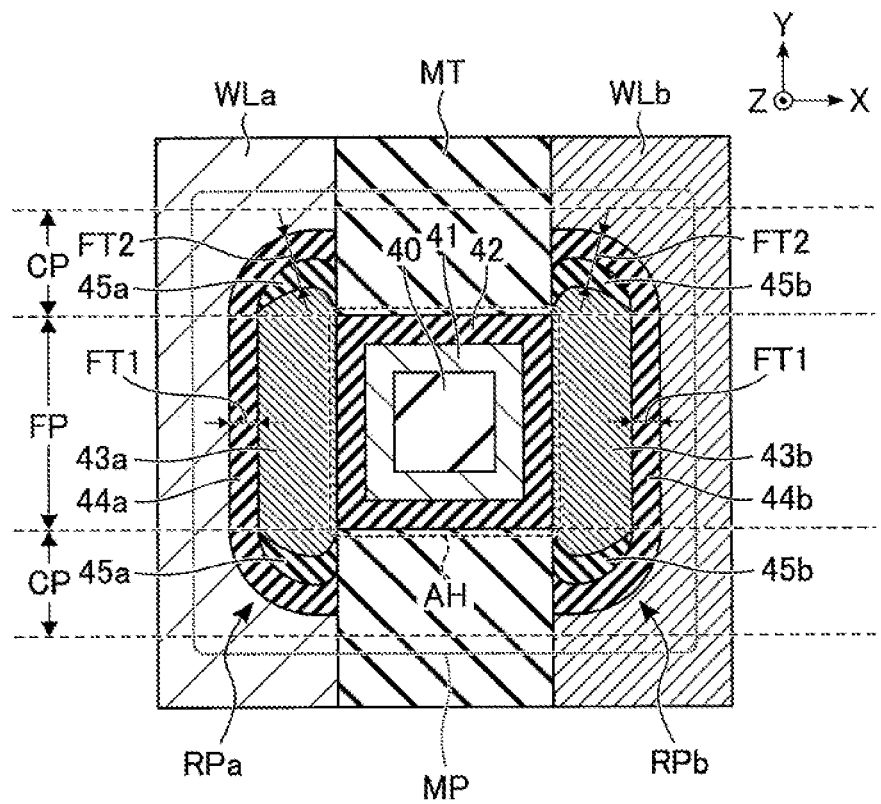

FIG. 21 shows an example of the cross-sectional structure of the memory pillar MP included in the semiconductor memory device according to the second embodiment, and shows a cross section which is parallel to the surface of the semiconductor substrate 20 and includes the word lines WLa and WLb. As shown in FIG. 21, in the semiconductor memory device 1 according to the second embodiment, the configuration of the block insulating films is different from that of the first embodiment. Specifically, the block insulating film of the first embodiment is formed of a single layer of the block insulating film 44, whereas, according to the second embodiment, the block insulating film in the curved part CP is formed of two layers of a block insulating film 44 and a block insulating film 45.

More specifically, in the second embodiment, the block insulating film 44a of the first embodiment is replaced with block insulating films 44a and 45a, and the block insulating film 44b of the first embodiment is replaced with block insulating films 44b and 45b. Since the structure of the block insulating films 44a and 45a in the recessed portion RPa is the same as that of the block insulating films 44b and 45b in the recessed portion RPb, they are described with common reference symbols in the following.

The shape of a set of block insulating films 44 and 45 is, for example, the same as the shape of the block insulating film 44 of the first embodiment. Namely, the conductive film. 43 in the recessed portion RP is covered with the set of block insulating films 44 and 45, excluding the part that is in contact with the tunnel insulating film 42. The block insulating film 44 is in contact with the word line WL. The insulating film 45 is provided between the block insulating film 44 and the conductive film 43. A part of each of the block insulating films 44 and 45 is in contact with the insulator in the memory trench MT.

In the flat part FP, for example, only the block insulating film 44 is provided between the word line WL and the conductive film 43. In the curved part CP, the set of block insulating films 44 and 45 is provided between the word line WL and the conductive film 43. A film thickness FT2 of the set of block insulating films 44 and 45 in the curved part CP is greater than a film thickness FT1 of the block insulating film 44 in the flat part FP. The film thickness of the block insulating film 44 in the curved part CP may be at least greater than FT1. In the flat part FP, the block insulating film 45 may be provided between the block insulating film 44 and the conductive film 43. In the second embodiment, the film thickness of the block insulating film in the curved part CP is at least greater than the flat part FP.

Figure 22:
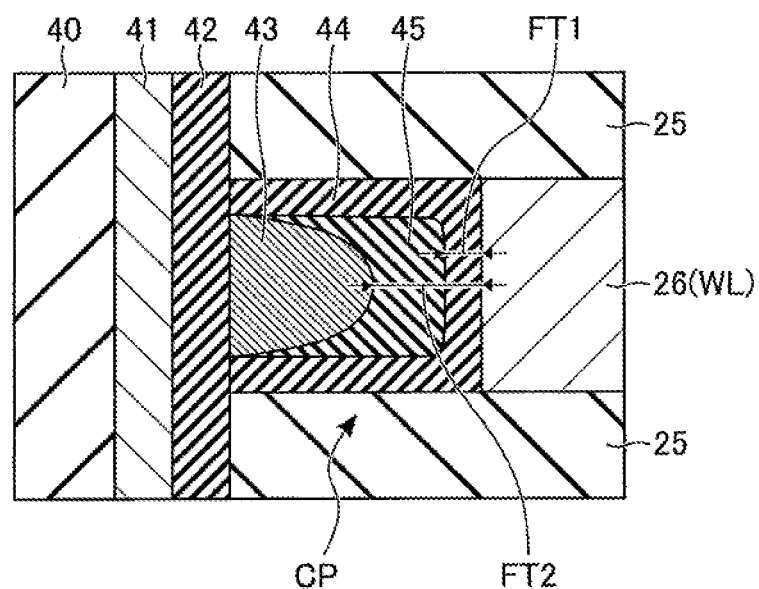

FIG. 22 shows an example of the cross section along the Z direction including the curved part CP of FIG. 21. As shown in FIG. 22, the block insulating film 44 in the curved part CP has, for example, the same film thickness FT1 also between the block insulating film 45 and the insulating layer 5. In other words, the film thickness of the block insulating film 44 between the insulating layer 25 and the block insulating film 45 is, for example, substantially the same as the film thickness of the block insulating film 44 between the conductive layer 26 and the block insulating film 45. In the curved part CP, the film thickness of the block insulating film 45 is, for example, decreased toward the tunnel insulating film 42 and increased toward the conductive layer 26. Accordingly, the part having the thickness of the total of the block insulating film 44 and block insulating film 45 between the conductive film 43 and the conductive layer 26 in the curved part CP includes a part having the film thickness FT2.

In the configuration of the memory pillar MP described above, the block insulating films 44a and 44b contain, for example, silicon oxide ($SiO_2$). The block insulating films 45a and 45b contain, for example, $HfO_2$ or SiON. The block insulating films 44a and 44b are formed of a material different from that of the block insulating films 45a and 45b. A material other than silicon oxide ($SiO_2$) may be used as the block insulating films 44a and 44b, and a material other than $HfO_2$ or SiON may be used as the block insulating films 45a and 45b. Since the other configurations of the semiconductor memory device 1 according to the second embodiment are the same as those of the semiconductor memory device 1 according to the first embodiment, descriptions of the configurations are omitted.

[2-2] Manufacturing Method of Semiconductor Memory Device 1

Figure 23:
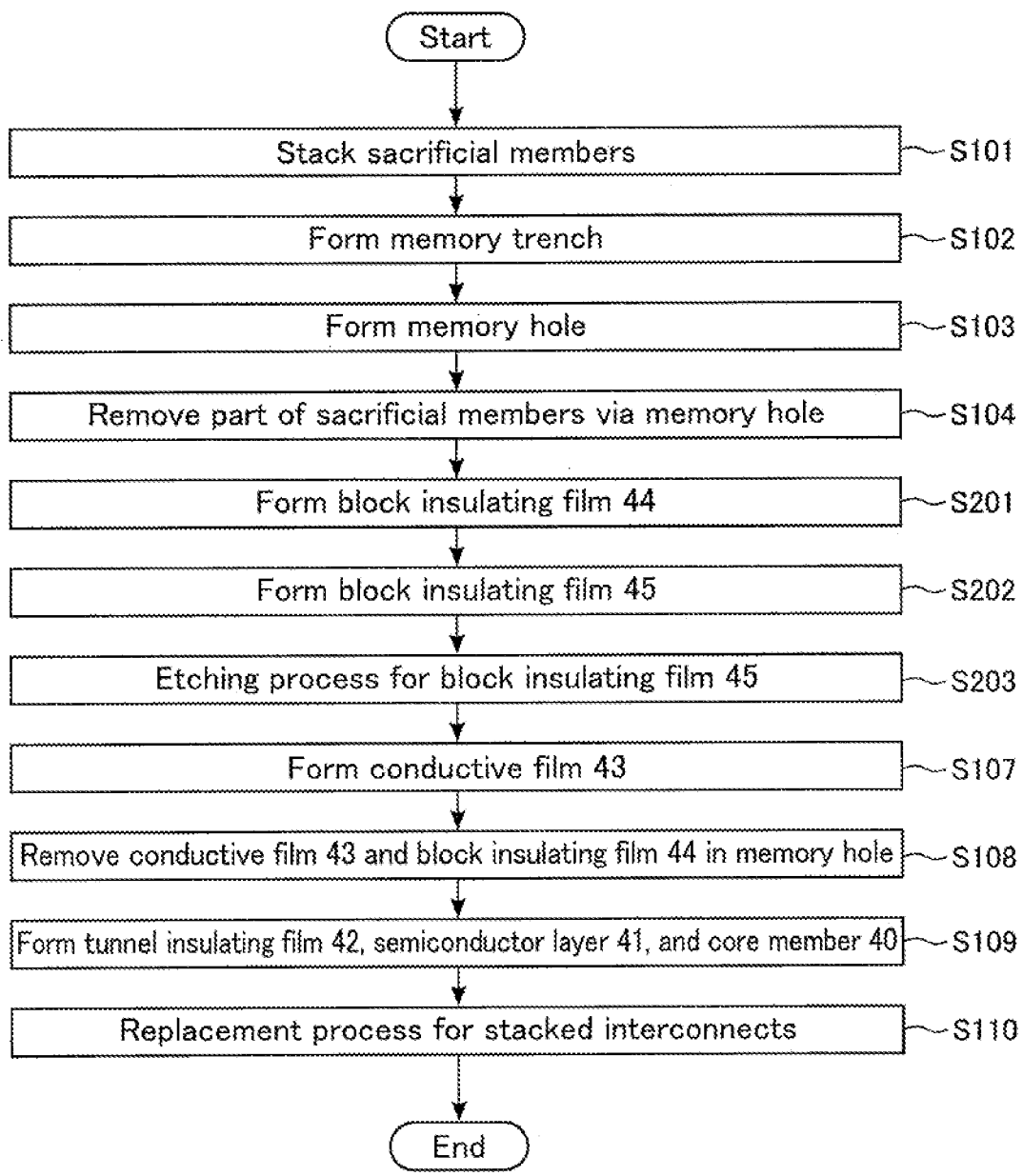
FIG. 23 is a flowchart showing an example of a manufacturing method of the semiconductor memory device according to the second embodiment.
Figure 24:
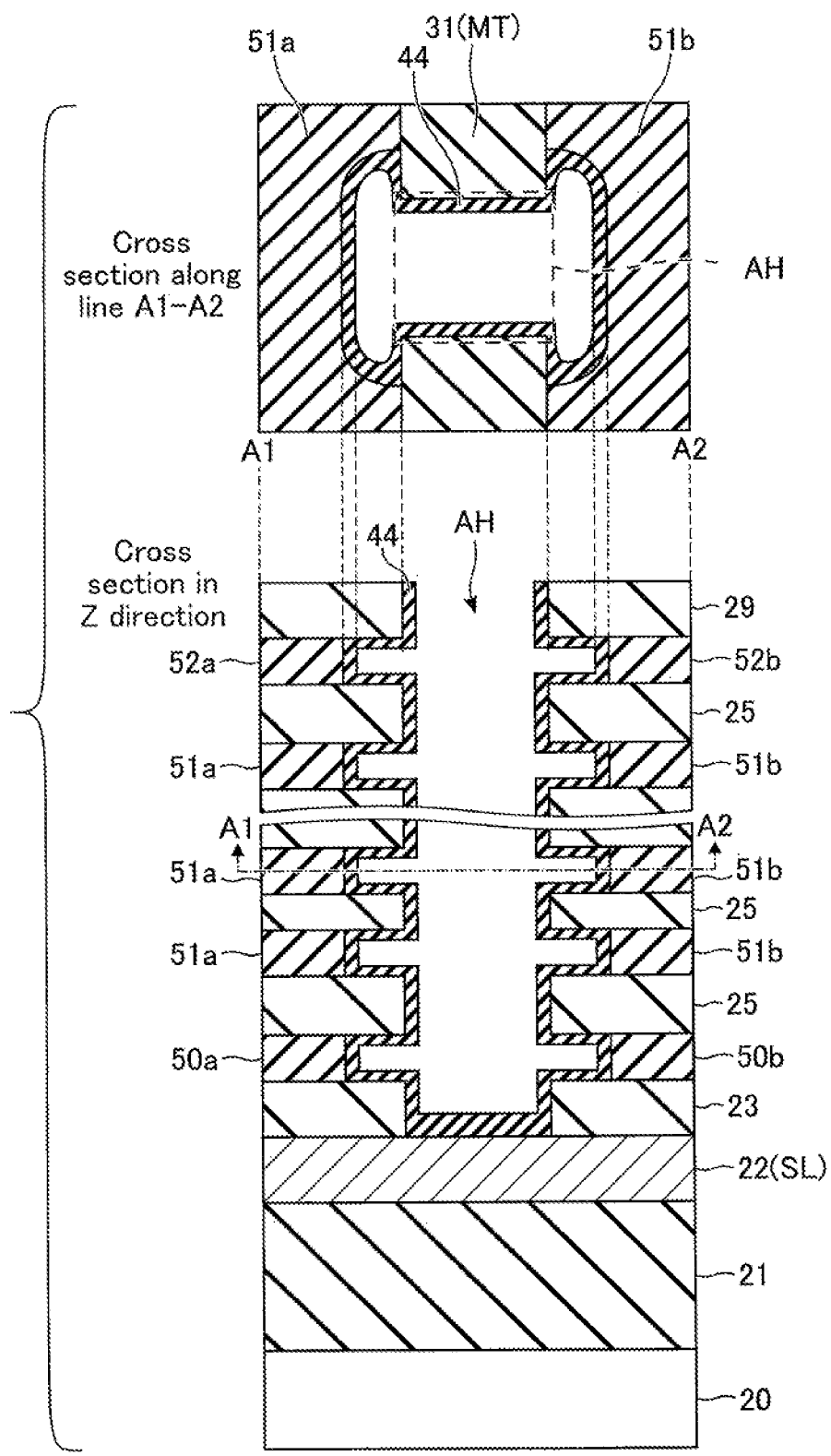
FIGS. 24 to 26 are cross-sectional views of the memory cell array showing examples of cross-sectional structures in the middle of the manufacturing process of the semiconductor memory device according to the second embodiment.
Figure 25:
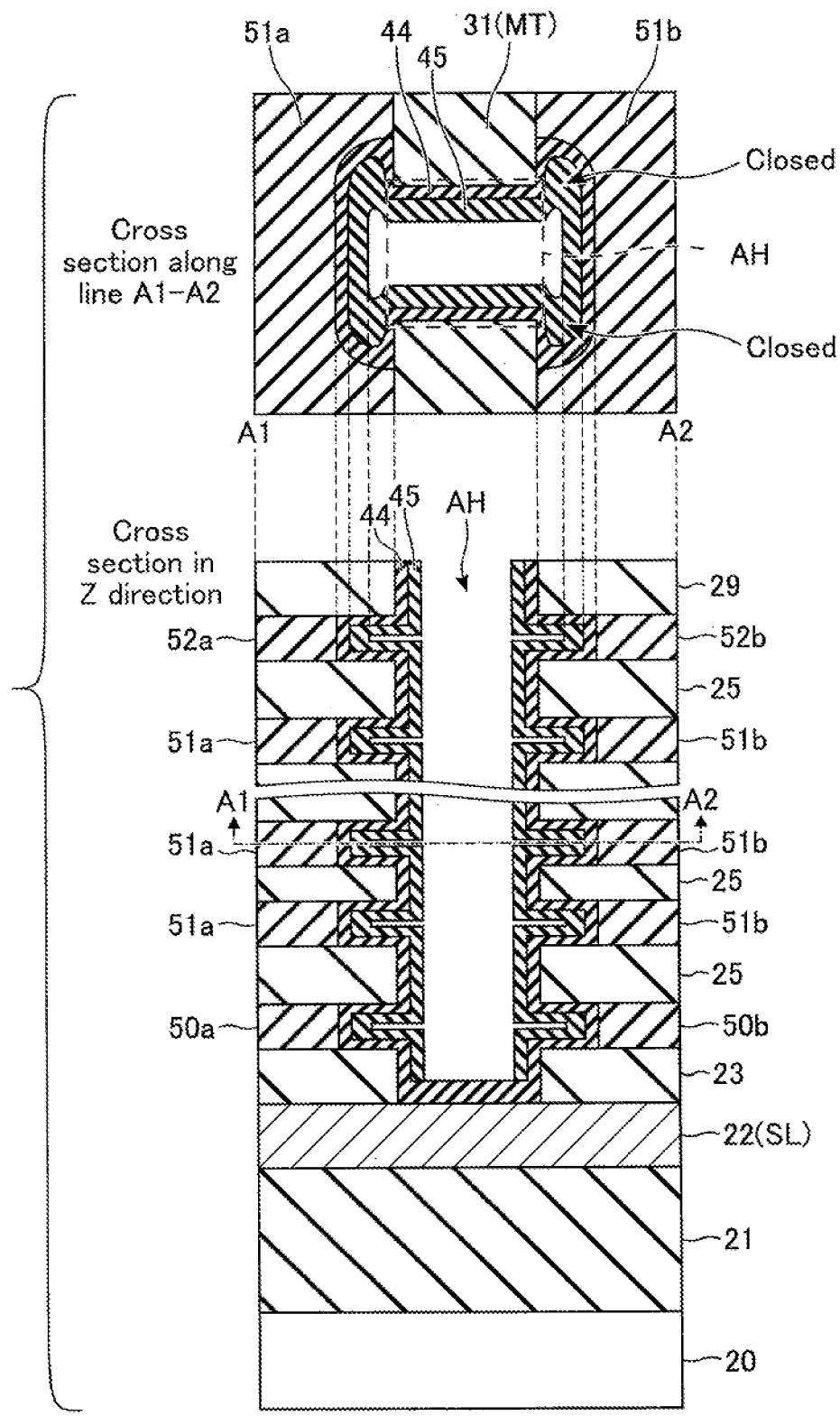
Figure 26:
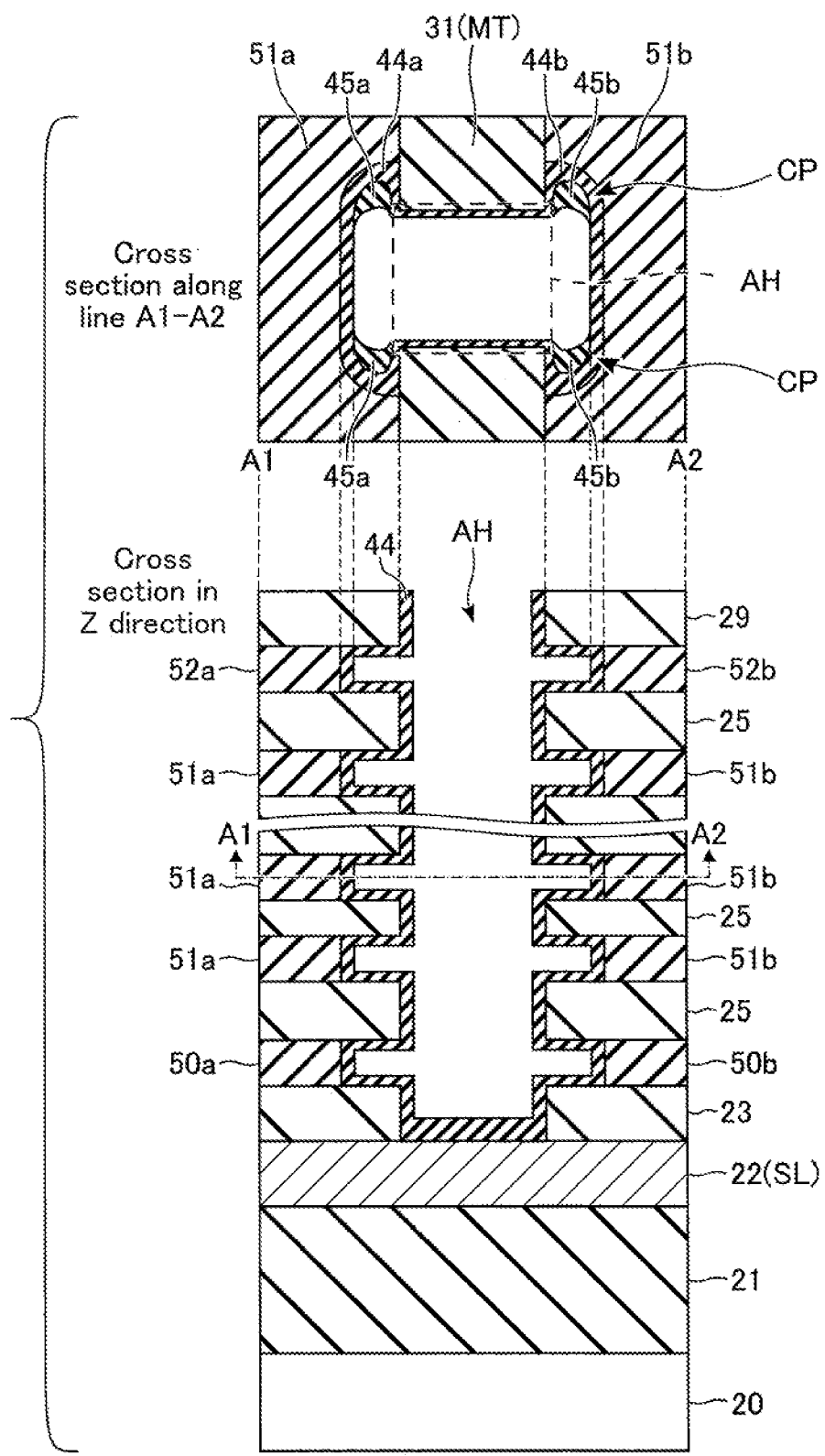

Next, with reference to FIG. 23 as needed, a description will be given of an example of a series of manufacturing steps relating to formation of the stacked interconnect structure inside the memory cell array 10 in the semiconductor memory device 1 according to the second embodiment. FIG. 23 is a flowchart showing an example of a manufacturing method of the semiconductor memory device according to the second embodiment. FIGS. 24 to 26 each show an example of the cross-section structure in the middle of manufacturing the semiconductor memory device 1 according to the second embodiment. The lower part of each of FIGS. 24 to 26 corresponds to a cross section of the region shown in FIG. 4, and the upper part of each of FIGS. 24 to 26 corresponds to a cross section taken along line A1-A2 in that figure.

First, processing of steps S101 to S104 is performed in order, similarly to the first embodiment.

Then, as shown in FIG. 24, the block insulating film 44 is formed on the side surface and the bottom surface in the memory hole AH, and the exposed surfaces in the recessed portions RPa and RPb (step S201). In this step, the block insulating film 44 is formed on the exposed surfaces in the recessed portions RP to, for example, a substantially uniform thickness. The thickness of the block insulating film 44 in the flat part FP at this time point corresponds to FT1.

Then, as shown in FIG. 25, the block insulating film 45 is formed on the exposed surfaces of the block insulating film 44 (step S202). In this step, the block insulating film 45 is formed to cover the block insulating film 44 on the side surface and the bottom surface of the memory hole AA and the recessed portions RP, so that the parts corresponding to the curved parts CP are closed.

Next, as shown in FIG. 26, a part of the block insulating film 45 is removed by isotropic etching (step S203). Specifically, in this step, the block insulating film 45 is processed, for example, to maintain only closed portions of the curved parts CP. In this case, the block insulating film 45 is removed from the flat part FP and the side surface of the memory hole AH, and the block insulating film 44 in regions other than the curved parts CP is exposed. The total thickness of the block insulating film 44 and block insulating film 45 in the curved parts CP at this time point corresponds to FT2.

As described above, the processing in steps S201 to S203 continuously forms the block insulating film 44 and the block insulating film 45 and closes the curved part CP with the block insulating film 45. Then, a set of block insulating films 44 and 45 is processed into a shape, for example, similar to that of the block insulating film 44 in the first embodiment. As a result, the structure is formed in which for example the block insulating film 44 is exposed in the flat part FP and the set of the block insulating films 44 and 45 remain in the curved part. In other words, the block insulating film in the curved part CP has the two-layered structure of the block insulating film 44 and the block insulating film 45, is thicker than the single-layered structure of the block insulating film 44 in the flat part FP.

Then, processing of steps S107 to S110 is sequentially performed, similarly to the first embodiment. As a result, in the second embodiment, the memory pillar MP, and the word lines WLa and WLb and the select gate lines SGSa, SGSb, SGDa and SGDb coupled to the memory pillar MP, are formed. The manufacturing processes have been described as an example, and other processes may be inserted between the processes described.

[2-3] Advantages of Second Embodiment

The semiconductor memory device 1 of the second embodiment has a structure in which, for example, the block insulating film is formed of a single layer of the block insulating film 44 in the flat part FP, and a double-layer of the block insulating film 44 and the block insulating film 45, which is made of a material different from that of the block insulating film 44, is formed in the curved part CP. Furthermore, as in the first embodiment, the total film thickness of the block insulating film 44 and the block insulating film 45 in the curved part CP is greater than the film thickness of the block insulating film of the block insulating film 44 in the flat part FP.

As a result, in the semiconductor memory device 1 according to the second embodiment, even if the electrical field concentration occurs in the curved part CP, a leak current flowing between the word line WL and the semiconductor layer 41 is suppressed by the thick block insulating film. Therefore, the semiconductor memory device 1 according to the second embodiment can suppress deterioration of the saturation characteristics of the memory cell transistor MC due to the leak current which may pass through the block insulating film.

Furthermore, in the semiconductor memory device 1 according to the second embodiment, the block insulating film 45 may be formed of a film having a higher tolerance for electrical stress, such as a material having a lower dielectric constant than that of the block insulating film 44. Therefore, the semiconductor memory device 1 according to the second embodiment can reduce the leak current from the block insulating film and suppress deterioration of the saturation characteristics of the memory cell MC transistor more effectively as compared to the first embodiment.

[3] Other Modifications

Figure 27:
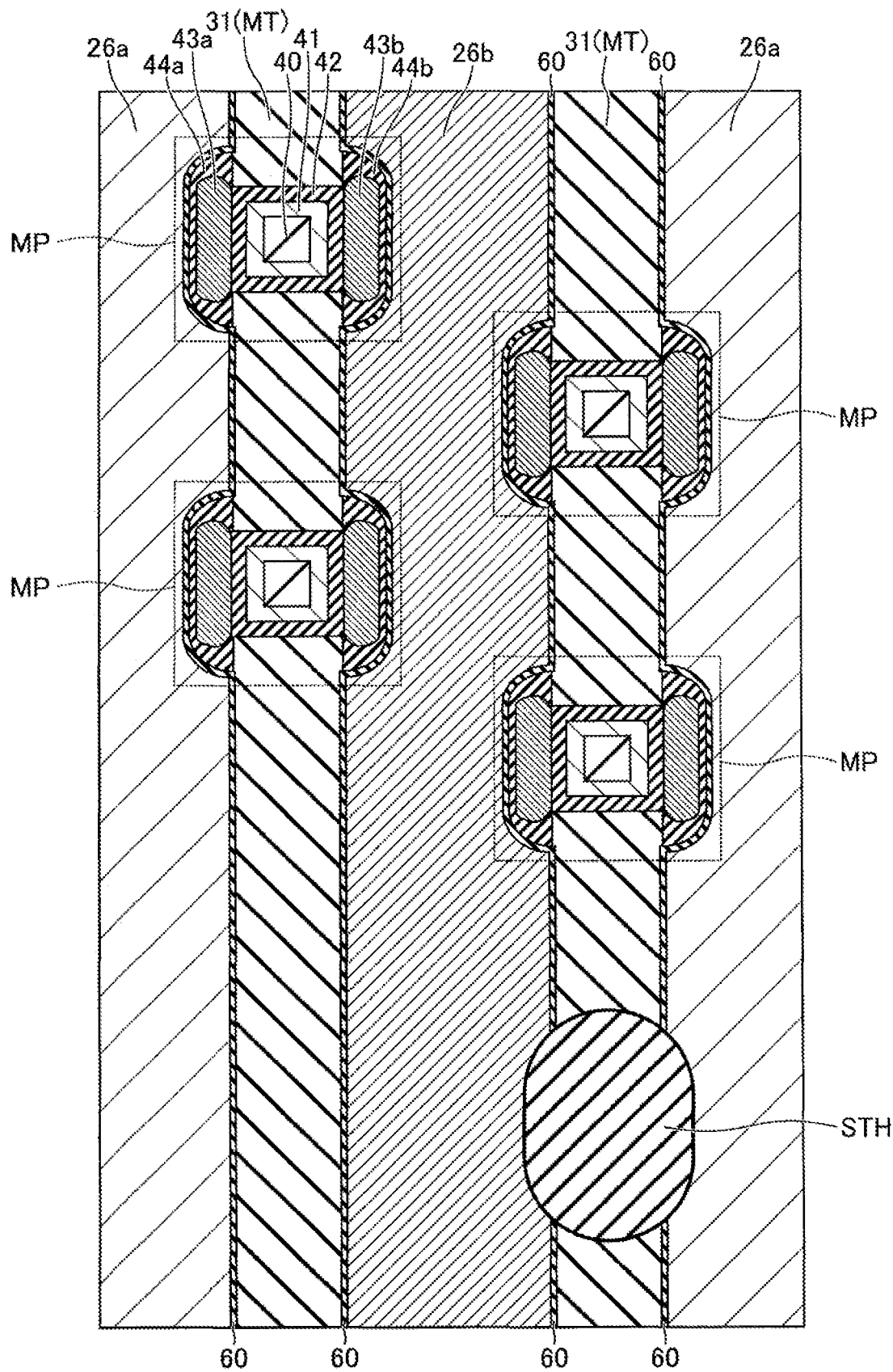
FIG. 27 is a cross-sectional view showing an example of a cross-sectional structure of a memory cell array included in a semiconductor memory device according to a modification of the first embodiment.

In the embodiments described above, the block insulating film 44 is in contact with the conductive layers 24, 26 or 28. However, a further block insulating film may be provided between the block insulating film 44 and the conductive layers 24, 26 or 28. FIG. 27 shows an example of a cross-sectional structure of the memory cell array 10 included in the semiconductor memory device 1 according to a modification of the first embodiment, showing a cross section including word lines WL. As shown in FIG. 27, in the memory cell array 10 of the modification, a block insulating film 60 is provided between a block insulating film 44a and a conductive layer 26a, and between a block insulating film 44b and a conductive layer 26b.

The block insulating film 60 may be continuously provided between the adjacent memory pillars MP. That is, the block insulating film 60 may be provided between the insulator 31 in the memory trench MT and each of the conductive layers 26a and 26b. In other words, the block insulating film 60 may be provided on the side surface of the insulator 31 (the memory trench MT) between the adjacent memory pillars MP. The relationship between the block insulating film 60 and the conductive layers 24 and 28 is the same as the relationship between the block insulating film 60 and the conductive layer 26. The block insulating film 60 contains, for example, aluminum oxide (AlO).

The step of forming the block insulating film 60 is inserted between, for example, step S104 and step S105 in FIG. 9. If the block insulating film 60 is provided between the adjacent memory pillars MP, a part of the block insulating film 60 is divided by a hole STH filled with an insulator. In brief, in the replacement process for the stacked interconnects of step S110, first, the hole STH is formed to expose the side surface of the sacrificial members 50 to 52. At this time, a part of the block insulating film 60 provided on a side surface portion of the memory trench MT is removed. Then, etching is performed via the hole STH, so that the sacrificial members 50 to 52 exposed to the hole STH are removed. The space obtained by removing the sacrificial members 50 to 52 is filled with a conductor, and the conductor formed on the side surface in the hole STH is removed. In this manner, the stacked interconnects, such as the word lines WL, are formed. The structure of the modification of the first embodiment may be applied to the second embodiment. In other words, the semiconductor memory device 1 according to the second embodiment may include a block insulating film 60.

In the above embodiments, the conductors used as the charge storage layers may have a stacked structure including two or more types of semiconductor, metal, and insulator. Each of the tunnel insulating film and block insulating film corresponding to the same memory group MG may be shared or separated by the transistors in the NAND strings NSa and NSb.

In the embodiments described above, the semiconductor layer 41 in the memory pillar MP is electrically coupled to the conductive layer 22 (source line SL) via the bottom surface of the memory pillar MP. The structure, however, is not limited thereto. For example, in the semiconductor memory device 1, the semiconductor layer 41 in the memory pillar MP may be coupled to the source line SL, via the side surface of the memory pillar MP.

The memory pillar MP in the embodiments described above may include two or more pillars connected in the Z direction. Moreover, the memory pillar MP may have a structure in which a pillar corresponding to the select gate line SGD and a pillar corresponding to the word line WL are coupled. The arrangement of memory pillars MP is not limited to four staggered rows, but may be of any arrangement. The number of bit lines BL overlapping each of the memory pillars MP may be determined as appropriate.

In the above embodiments, an example of the semiconductor memory device 1 having a structure in which a circuit, such as the sense amplifier module 16, is provided below the memory cell array 10 has been explained; however, the structure is not limited thereto. For example, the semiconductor memory device 1 may have a structure in which a chip provided with the sense amplifier module 16, etc. and a chip provided with the memory cell array 10 are bonded to each other.

In the drawings used for the explanation of the embodiments, for example, the memory pillar MP maintains a uniform outside diameter from the top layer to the bottom layer; however, the memory pillar is not limited to this example. For example, the memory pillar MP may be tapered or reverse tapered, or may be bulged in the middle. Similarly, the memory trench MT may be tapered or reverse tapered, or may be bulged in the middle.

In this specification, the term 'isotropic' is used to refer to a structure formed by isotropic etching. Thus, the shape of each of the recessed portion RPa and RPb may be at least based on a shape formed by isotropic etching. Therefore, in the flat part FP of the recessed portions RPa and RPb, the block insulating film 44 may not necessarily be flat, but may have a curvature. In this case, the block insulating film 44 may have a shape in which the curvature of the curved part CP is at least greater than the curvature of the flat part FP.

In this specification, the term "coupling" refers to electrical coupling, and does not exclude intervention of another element. The expression "electrical coupling" may refer to coupling via an insulator as long as an operation similar to that of the electrical coupling can be performed. A "pillar" refers to a structure arranged in a hole formed in the process of producing the semiconductor memory device 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a first conductive layer extending in a first direction within a first layer;
   a first insulating region extending in the first direction within the first layer and adjacent to the first conductive layer in a second direction intersecting the first direction; and
   a first pillar extending in a third direction intersecting the first direction and the second direction, dividing the first insulating region, and provided in contact with the first conductive layer;
   wherein:
   the first pillar includes a first portion that divides the first insulating region, and a second portion that includes a part isotropically extending from the first portion toward the first conductive layer within the first layer;
   the first portion includes a first semiconductor layer extending in the third direction and a first insulating film provided on a side surface of the first semiconductor layer;
   the first pillar includes a first region that faces the first portion in the first direction and a second region other than the first region; and
   the second portion includes a first conductive film that is in contact with the first insulating film and a second insulating film provided between the first conductive film and the first conductive layer, the second insulating film having a first thickness in a fourth direction parallel to a surface of a substrate and different from each of the first to third directions within the second region and a second thickness in the second direction within the first region, the first thickness being greater than the second thickness.

2. The semiconductor memory device of claim 1, further comprising a second conductive layer that sandwiches the first insulating region and the first pillar with the first conductive layer,
   wherein:
   the first pillar further includes a third portion that includes a part isotropically extending from the first portion toward the second conductive layer within the first layer;
   the first pillar includes a third region that faces the first portion in the first direction and a fourth region other than the third region; and
   the third portion includes a second conductive film that is in contact with the first insulating film and a third insulating film provided between the second conductive film and the second conductive layer, the third insulating film having a third thickness in the fourth direction within the fourth region and a fourth thickness in the second direction within the third region, the third thickness being greater than the fourth thickness.

3. The semiconductor memory device of claim 1, further comprising a second conductive layer extending in the first direction within a second layer apart from the first layer in the third direction and provided above the first conductive layer, wherein:
the first pillar further includes a third portion that is in contact with the second conductive layer and includes a part isotropically extending from the first portion toward the second conductive layer within the second layer;
the third portion includes a second conductive film that is in contact with the first insulating film and a third insulating film provided between the second conductive film and the second conductive layer, the third insulating film having a third thickness in the fourth direction within the second region and a fourth thickness in the second direction within the first region, the third thickness being greater than the fourth thickness; and
the first conductive film and the second conductive film within the first pillar are apart from each other.

4. The semiconductor memory device of claim 2, further comprising:
a third conductive layer extending in the first direction within a second layer apart from the first layer in the third direction and provided above the first conductive layer; and
a fourth conductive layer extending in the first direction within the second layer, provided above the second conductive layer, and adjacent to the third conductive layer in the second direction,
wherein:
the first pillar further includes a fourth portion that is provided between the third conductive layer and the fourth conductive layer and includes a part isotropically extending from the first portion toward the third conductive layer within the second layer, and a fifth portion that includes a part isotropically extending from the first portion toward the fourth conductive layer within the second layer;
the fourth portion includes a third conductive film that is in contact with the first insulating film and a fourth insulating film provided between the third conductive film and the third conductive layer, the fourth insulating film having a fifth thickness in the fourth direction within the second region and a sixth thickness in the second direction within the first region, the fifth thickness being greater than the sixth thickness;
the fifth portion includes a fourth conductive film that is in contact with the first insulating film and a fifth insulating film provided between the fourth conductive film and the fourth conductive layer, the fifth insulating film having a seventh thickness in the fourth direction within the fourth region and a eighth thickness in the second direction within the third region, the seventh thickness being greater than the eighth thickness; and
the first conductive film, the second conductive film, the third conductive film, and the fourth conductive film within the first pillar are apart from one another.

5. The semiconductor memory device of claim 1, further comprising a second pillar extending in the third direction and adjacent to the first pillar, dividing the first insulating region, and provided in contact with the first conductive layer,
wherein:
the second pillar includes a third portion that divides the first insulating region, and a fourth portion that includes a part isotropically extending from the third portion toward the first conductive layer within the first layer;
the third portion includes a second semiconductor layer extending in the third direction and a third insulating film provided on a side surface of the second semiconductor layer;
the second pillar includes a third region that faces the third portion in the first direction and a fourth region other than the third region;
the fourth portion includes a second conductive film that is in contact with the third insulating film and a fourth insulating film provided between the second conductive film and the first conductive layer, the fourth insulating film having a third thickness in the fourth direction within the fourth region and a fourth thickness in the second direction within the third region, the third thickness being greater than the fourth thickness; and
the second insulating film within the first pillar is apart from the fourth insulating film within the second pillar.

6. The semiconductor memory device of claim 2, further comprising a second pillar extending in the third direction and adjacent to the first pillar, dividing the first insulating region, and provided between the first conductive layer and the second conductive layer,
wherein:
the second pillar includes a fourth portion that divides the first insulating region, a fifth portion that includes a part isotropically extending from the fourth portion toward the first conductive layer within the first layer, and a sixth portion that includes a part isotropically extending from the fourth portion toward the second conductive layer within the first layer;
the fourth portion includes a second semiconductor layer extending in the third direction and a fourth insulating film provided on a side surface of the second semiconductor layer;
the second pillar includes a fifth region that faces the fourth portion in the first direction and a sixth region other than the fifth region;
the fifth portion includes a third conductive film that is in contact with the fourth insulating film and a fifth insulating film provided between the third conductive film and the first conductive layer, the fifth insulating film having a fifth thickness in the fourth direction within the sixth region and a sixth thickness in the second direction within the fifth region, the fifth thickness being greater than the sixth thickness;
the sixth portion includes a fourth conductive film that is in contact with the fourth insulating film and a sixth insulating film provided between the fourth conductive film and the second conductive layer, the sixth insulating film having a seventh thickness in the fourth direction within the sixth region and a eighth thickness in the second direction within the fifth region, the seventh thickness being greater than the eighth thickness; and
the second and third insulating films within the first pillar are apart from the fifth and sixth insulating films within the second pillar.

7. The semiconductor memory device of claim 1, wherein the second insulating film includes a third insulating film that is in contact with the first conductive layer within the first region and the second region, and a fourth insulating film provided between the third insulating film and the first conductive film within the second region.

8. The semiconductor memory device of claim 7, wherein the third insulating film and the fourth insulating film include different materials.

9. The semiconductor memory device of claim 8, wherein:
  the third insulating film is a silicon dioxide film; and
  the fourth insulating film includes silicon nitride.

10. The semiconductor memory device of claim 2, further comprising:
  a second insulating region extending in the first direction within the first layer and adjacent to the first conductive layer on an opposite side of the first insulating region in the second direction; and
  a second pillar extending in the third direction and dividing the second insulating region,
  wherein:
  the second pillar includes a third portion that divides the second insulating region, and a fourth portion that includes a part isotropically extending from the third portion toward the first conductive layer within the first layer;
  the third portion includes a second semiconductor layer extending in the third direction and a third insulating film provided on a side surface of the second semiconductor layer;
  the second pillar includes a third region that faces the third portion in the first direction and a fourth region other than the third region; and
  the fourth portion includes a second conductive film that is in contact with the third insulating film and a fourth insulating film provided between the second conductive film and the first conductive layer, the fourth insulating film having a fifth thickness in the fourth direction within the fourth region and a sixth thickness in the second direction within the third region, the fifth thickness being greater than the sixth thickness.

11. The semiconductor memory device of claim 10, wherein the first pillar and the second pillar are staggered in the first direction.

12. The semiconductor memory device of claim 11, further comprising:
  a plurality of third pillars arranged adjacently to the first pillar in the first direction; and
  a plurality of fourth pillars arranged adjacently to the second pillar in the first direction, wherein
  each of the third pillars and each of the fourth pillars are staggered in the first direction.

13. The semiconductor memory device of claim 1, further comprising a third insulating film provided between the first conductive layer and the second insulating film.

14. The semiconductor memory device of claim 5, further comprising:
  a fifth insulating film provided between the first conductive layer and the second insulating film; and
  a sixth insulating film provided between the first conductive layer and the fourth insulating film, wherein
  the fifth insulating film and the sixth insulating film are in contact.

15. The semiconductor memory device of claim 14, wherein each of the fifth insulating film and the sixth insulating film includes aluminum nitride.

16. The semiconductor memory device of claim 1, further comprising:
  a bit line; and
  a source line;
  wherein:
  a part of the first pillar facing the first conductive layer functions as a first memory cell transistor; and
  the first memory cell transistor is coupled between the bit line and the source line.

* * * * *